United States Patent
Nickel

(10) Patent No.: US 9,157,954 B2
(45) Date of Patent: Oct. 13, 2015

(54) TEST SYSTEM WITH TEMPORARY TEST STRUCTURES

(75) Inventor: Joshua G. Nickel, San Jose, CA (US)

(73) Assignee: Apple Inc., Cupertino, CA (US)

( * ) Notice: Subject to any disclaimer, the term of this patent is extended or adjusted under 35 U.S.C. 154(b) by 577 days.

(21) Appl. No.: 13/153,153

(22) Filed: Jun. 3, 2011

(65) Prior Publication Data

US 2012/0306521 A1    Dec. 6, 2012

(51) Int. Cl.
| | |
|---|---|
| G01R 31/20 | (2006.01) |
| G01R 31/302 | (2006.01) |
| H01L 21/00 | (2006.01) |
| H01Q 1/24 | (2006.01) |
| H01Q 1/44 | (2006.01) |
| H01Q 9/42 | (2006.01) |

(52) U.S. Cl.
CPC ............ *G01R 31/3025* (2013.01); *H01L 21/00* (2013.01); *H01Q 1/243* (2013.01); *H01Q 1/44* (2013.01); *H01Q 9/42* (2013.01); *H01L 2221/00* (2013.01); *H01L 2924/00* (2013.01)

(58) Field of Classification Search
CPC . H01L 21/00; H01L 2221/00; H01L 2223/00; H01L 2924/00; H01L 2925/00; H04B 1/00; H04B 2201/00; H04B 2203/00; H04B 2215/00
USPC ................ 324/73.1, 750.16, 754.03, 754.31, 324/762.01; 438/14–18; 343/703, 906
See application file for complete search history.

(56) References Cited

U.S. PATENT DOCUMENTS

| | | | |
|---|---|---|---|
| 4,851,794 A * | 7/1989 | Williams et al. ................ 333/33 |
| 5,389,556 A * | 2/1995 | Rostoker et al. ................ 438/17 |
| 5,578,930 A * | 11/1996 | Sheen .......................... 324/530 |
| 7,053,643 B2 | 5/2006 | Ruff et al. |
| 7,081,869 B2 | 7/2006 | Sommerfeld et al. |
| 7,132,997 B2 * | 11/2006 | Uesaka et al. ................ 343/867 |
| 7,876,276 B1 * | 1/2011 | Zaman et al. ................ 343/703 |
| 2003/0146771 A1 * | 8/2003 | Moore .......................... 324/765 |
| 2006/0125508 A1 * | 6/2006 | Glidden et al. ............... 324/765 |
| 2007/0053310 A1 * | 3/2007 | Ishizawa et al. ............. 370/272 |
| 2007/0069759 A1 * | 3/2007 | Rzepiela et al. .............. 324/765 |

(Continued)

OTHER PUBLICATIONS

Nickel, U.S. Appl. No. 13/092,808, filed Apr. 22, 2011.

(Continued)

*Primary Examiner* — Huy Q Phan
*Assistant Examiner* — Temilade S Rhodes-Vivour
(74) *Attorney, Agent, or Firm* — Treyz law Group; Jason Tsai

(57) ABSTRACT

Electronic device structures such as a conductive housing member that forms part of an antenna may be tested during manufacturing. A test system may be provided that includes a test probe configured to energize the conductive housing member or other conductive structures under test and that includes temporary test structures that may be placed in the vicinity of or in direct contact with the device structures during testing to facilitate detection of manufacturing defects. Test equipment such as a network analyzer may provide radio-frequency test signals in a range of frequencies. An antenna probe may be used to gather corresponding wireless radio-frequency signal data. Forward transfer coefficient data may be computed from the transmitted and received radio-frequency signals. The forward transfer coefficient data or other test data may be compared to reference data to determine whether the device structures contain a fault.

21 Claims, 17 Drawing Sheets

(56) References Cited

U.S. PATENT DOCUMENTS

| | | | |
|---|---|---|---|
| 2010/0073020 A1* | 3/2010 | Lim et al. | 324/754 |
| 2010/0213962 A1* | 8/2010 | Balcazar et al. | 324/758 |
| 2010/0295569 A1 | 11/2010 | Chu et al. | |
| 2011/0032162 A1 | 2/2011 | Li et al. | |
| 2011/0084719 A1 | 4/2011 | Jiang | |

OTHER PUBLICATIONS

Nickel, U.S. Appl. No. 13/097,847, filed Apr. 29, 2011.
Nickel, U.S. Appl. No. 13/111,926, filed May 19, 2011.

* cited by examiner

300 ⎯ 0.7 - 0.08 mm (FAULTY)
302 ⎯ 0.7 + 0.08 mm (SATISFACTORY)
304 ⎯ 0.7 - 0.08 mm (FAULTY WITH TEMPORARY TEST STRUCTURES)
306 ⎯ 0.7 + 0.08 mm (SATISFACTORY WITH TEMPORARY TEST STRUCTURES)

310 ——— DIFFERENCE BETWEEN FAULTY & SATISFACTORY (WITHOUT STRUCTURES 112)

312 ------- DIFFERENCE BETWEEN FAULTY & SATISFACTORY (WITH STRUCTURES 112)

TEST SYSTEM WITH TEMPORARY TEST STRUCTURES

BACKGROUND

This relates generally to testing, and more particularly, to testing electronic device structures for manufacturing faults.

Electronic devices such as portable computers and cellular telephones are often provided with wireless communications capabilities. For example, electronic devices may use long-range wireless communications circuitry such as cellular telephone circuitry and short-range wireless communications circuitry such as wireless local area network circuitry.

In some devices, conductive housing structures may form part of an electronic device antenna. The performance of this type of antenna may depend on how accurately the conductive housing structures are manufactured. Excessive variations in the size and shape of conductive electronic device housing structures or other manufacturing variations may have a negative impact on the performance of antennas formed using the structures. Variations in conductive electronic device structures of other types may also impact device performance.

It would be desirable to be able to provide ways to test electronic device structures such as conductive electronic device structures that form parts of antennas and other structures.

SUMMARY

Electronic devices may include conductive structures such as conductive housing structures. Conductive electronic device housing structures may form part of an antenna or other structures.

To ensure that conductive electronic device structures have been fabricated properly, the conductive electronic device structures may be tested during manufacturing. A test system may be provided that includes a test probe (e.g., a wireless test probe, a contact probe with pins, a capacitive coupling test probe, etc.) and an antenna test probe.

The test system may also include temporary test structures that may be placed in the vicinity of or in direct contact with the device structures under test and that may serve to facilitate in the detection of manufacturing defects in the device structures (e.g., the use of the temporary test structures during early stages of production may help reveal defects that would normally manifest their negative impact on device performance only during later stages of production). Upon completion of testing, the temporary test structures may be removed from the device structures. The temporary test structures may resemble components that are actually assembled within a finished product or other structures that are not normally part of the finished product.

Test equipment such as a network analyzer may provide radio-frequency test signals in a range of frequencies. The radio-frequency test signals may be applied to the conductive housing member or other conductive structures under test using the test probe contacts. The antenna test probe may be used to gather corresponding wireless radio-frequency data.

Forward transfer coefficient data may be computed from the transmitted and received radio-frequency signals. The forward transfer coefficient data or other test data may be compared to reference data to determine whether the conductive electronic device structures contain a fault.

Further features of the invention, its nature and various advantages will be more apparent from the accompanying drawings and the following detailed description of the preferred embodiments.

DETAILED DESCRIPTION

Figure 1:
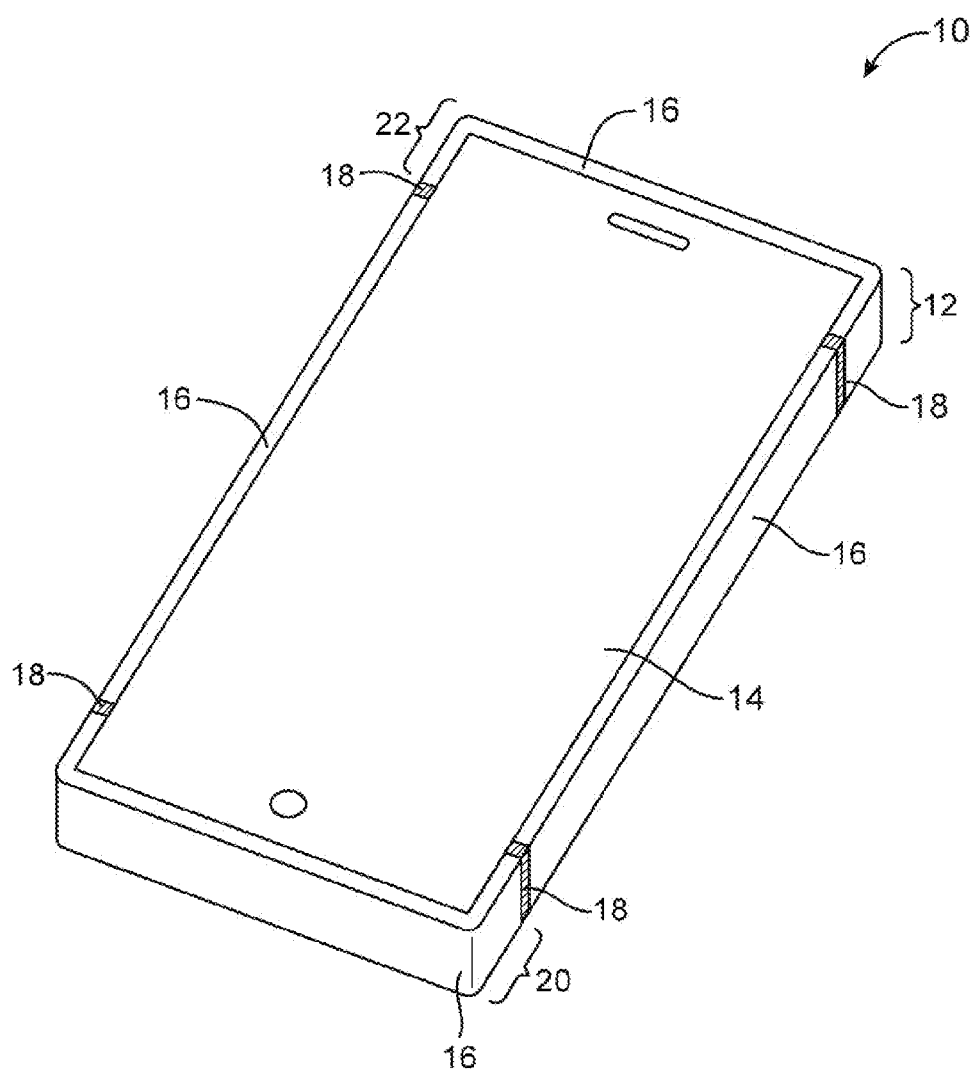
FIG. 1 is a perspective view of an illustrative electronic device of the type that may include conductive housing structures that may be tested in accordance with an embodiment of the present invention.

Electronic devices may be provided with wireless communications circuitry such as antennas and associated transceiver circuits. The wireless communications circuitry may be used to support wireless communications in multiple wireless communications bands. The wireless communications circuitry may include one or more antennas.

The antennas can include loop antennas, inverted-F antennas, strip antennas, planar inverted-F antennas, slot antennas, hybrid antennas that include antenna structures of more than one type, or other suitable antennas. Conductive structures for the antennas may, if desired, be formed from conductive housing structures. The housing structures may include a peripheral conductive member that runs around the periphery of an electronic device. The peripheral conductive member may serve as a bezel for a planar structure such as a display, may serve as sidewall structures for a device housing, or may form other housing structures. Gaps in the peripheral conductive member may be associated with the antennas.

The size of the gaps and the presence or absence of manufacturing artifacts such as metal burrs or other unintended conductive structures in the gaps and other abnormalities in the peripheral conductive member that are produced during manufacturing can influence the electrical properties of the antennas that are formed using the peripheral conductive housing member. To ensure that the peripheral conductive member is manufactured properly, it may be desirable to electrically test the peripheral conductive housing member during manufacturing. The electrical test measurements may reveal undesired manufacturing variations in the gaps (as an example). Other conductive electronic device structures may also be tested in this way if desired.

With conventional testing arrangements, these faults may sometimes be detected after final assembly operations are complete. For example, over-the-air wireless tests on a fully assembled device may reveal that an antenna is not performing within desired limits. This type of fault may be due to variation in the size of the gaps, the presence of metal burrs in the gaps, variation in the thickness of the peripheral conductive member, splits along the peripheral conductive member, or other manufacturing defects in the peripheral conductive member. Detection of faults at late stages in the assembly process may, however, result in the need for extensive reworking. It may often be impractical to determine the nature of the fault, forcing the device to be scrapped.

A typical test setup used to detect such types of manufacturing defects involves passive antenna testing. During passive antenna testing, the antenna is energized using a radio-frequency input signal, the reflection of which is measured to obtain a reflection coefficient (S11). Simply monitoring S11 may not sufficiently characterize the antenna because no radiated signal from the antenna is measured. Certain defects may cause a drop in antenna efficiency without a corresponding or measureable change to antenna input impedance (i.e., certain defects cannot be detected by simply monitoring S11). In these cases, only a radiated test is capable of detecting such variations. This requires an antenna test probe that samples signals radiated from the antenna under test.

An illustrative electronic device of the type that may be provided with conductive electronic device structures such as a peripheral conductive housing member that forms part of one or more antennas is shown in FIG. 1. Electronic device 10 may be a portable electronic device or other suitable electronic device. For example, electronic device 10 may be a laptop computer, a tablet computer, a somewhat smaller device such as a wrist-watch device, pendant device, headphone device, earpiece device, or other wearable or miniature device, a cellular telephone, a media player, etc.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material. In other situations, housing 12 or at least some of the structures that make up housing 12 may be formed from metal elements.

Device 10 may, if desired, have a display such as display 14. Display 14 may, for example, be a touch screen that incorporates capacitive touch electrodes. Display 14 may include image pixels formed from light-emitting diodes (LEDs), organic LEDs (OLEDs), plasma cells, electronic ink elements, liquid crystal display (LCD) components, or other suitable image pixel structures. A cover glass layer may cover the surface of display 14. Buttons such as button 19 may pass through openings in the cover glass.

Housing 12 may include structures such as housing member 16. Member 16 may run around the rectangular periphery of device 10 and display 14. Member 16 or part of member 16 may serve as a bezel for display 14 (e.g., a cosmetic trim that surrounds all four sides of display 14 and/or helps hold display 14 to device 10). Member 16 may also, if desired, form sidewall structures for device 10.

Member 16 may be formed of a conductive material and may therefore sometimes be referred to as a peripheral conductive housing member or conductive housing structures. Member 16 may be formed from a metal such as stainless steel, aluminum, or other suitable materials. One, two, or more than two separate structures may be used in forming member 16.

It is not necessary for member 16 to have a uniform cross-section. For example, the top portion of member 16 may, if desired, have an inwardly protruding lip that helps hold display 14 in place. If desired, the bottom portion of member 16 may also have an enlarged lip (e.g., in the plane of the rear surface of device 10). In the example of FIG. 1, member 16 has substantially straight vertical sidewalls. This is merely illustrative. The sidewalls of member 16 may be curved or may have any other suitable shape. In some configurations (e.g., when member 16 serves as a bezel for display 14), member 16 may run around the lip of housing 12 (i.e., member 16 may cover only the edge of housing 12 that surrounds display 14 and not the rear edge of the sidewalls of housing 12).

Display 14 may include conductive structures such as an array of capacitive electrodes, conductive lines for addressing pixel elements, driver circuits, etc. Housing 12 may include internal structures such as metal frame members, a planar housing member (sometimes referred to as a midplate) that spans the walls of housing 12 (i.e., a sheet metal structure that is welded or otherwise connected between the opposing right and left sides of member 16), printed circuit boards, and other internal conductive structures. These conductive structures may be located in center of housing 12 (as an example).

In regions 20 and 22, openings may be formed between the conductive housing structures and conductive electrical components that make up device 10. These openings may be filled with air, plastic, and other dielectrics. Conductive housing structures and other conductive structures in device 10 may serve as a ground plane for the antennas in device 10. The openings in regions 20 and 22 may serve as slots in open or closed slot antennas, may serve as a central dielectric region that is surrounded by a conductive path of materials in a loop antenna, may serve as a space that separates an antenna resonating element such as a strip antenna resonating element or an inverted-F antenna resonating element from the ground plane, or may otherwise serve as part of antenna structures formed in regions 20 and 22.

Portions of member 16 may be provided with gap structures 18. Gaps 18 may be filled with dielectric such as polymer, ceramic, glass, etc. Gaps 18 may divide member 16 into one or more peripheral conductive member segments. There may be, for example, two segments of member 16 (e.g., in an arrangement with two gaps), three segments of member 16 (e.g., in an arrangement with three gaps), four segments of member 16 (e.g., in an arrangement with four gaps, etc.). The segments of peripheral conductive member 16 that are formed in this way may form parts of antennas in device 10 and may therefore sometimes be referred to as conductive antenna structures.

Figure 2:
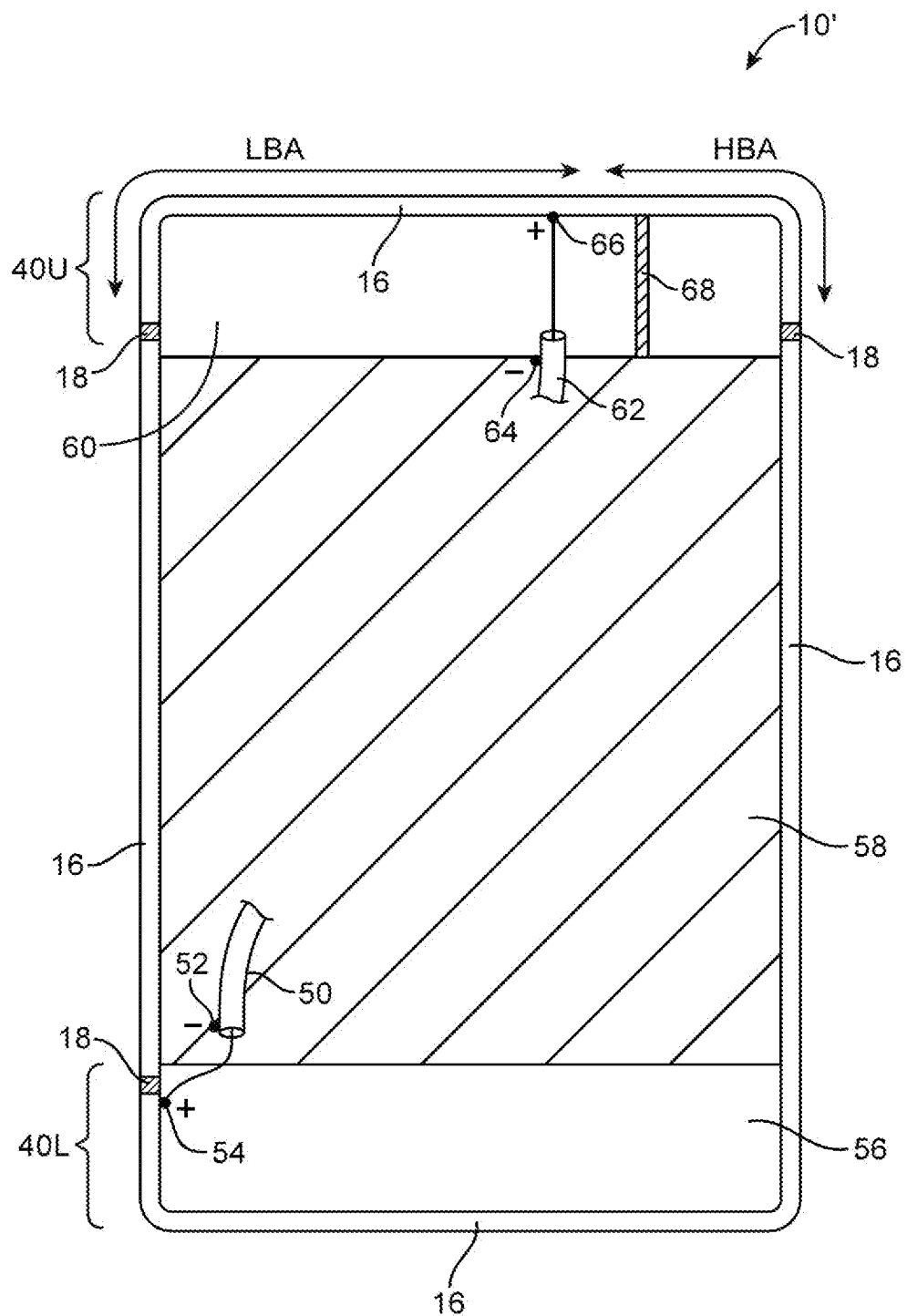
FIG. 2 is a top view of an illustrative electronic device of the type shown in FIG. 1 showing the locations of gaps in a peripheral conductive housing member and the locations of possible antennas within the electronic device in accordance with an embodiment of the present invention.

A top view of an interior portion of device 10 is shown in FIG. 2. If desired, device 10 may have upper and lower antennas (as an example). An upper antenna such as antenna 40U may, for example, be formed at the upper end of device 10 in region 22. A lower antenna such as antenna 40L may, for example, be formed at the lower end of device 10 in region 20. The antennas may be used separately to cover separate communications bands of interest or may be used together to implement an antenna diversity scheme or a multiple-input-multiple-output (MIMO) antenna scheme.

Antenna 40L may be formed from the portions of midplate 58 and peripheral conductive housing member 16 that surround dielectric-filled opening 56. Antenna 40L may be fed by transmission line 50, which is coupled to positive feed terminal 54 and ground feed terminal 52. Other feed arrangements may be used if desired. The arrangement of FIG. 2 is merely illustrative.

Antenna 40U may be formed from the portions of midplate 58 and peripheral conductive housing member 16 that surround dielectric-filled opening 60. Member 16 may have a low-band segment LBA that terminates at one of gaps 18 and a high-band segment HBA that terminates at another one of gaps 18. Antenna 40U may be fed using transmission line 62. Transmission line 62 may be coupled to positive antenna feed terminal 66 and ground antenna feed terminal 64 (as an example). Conductive member 68 may span opening 60 to form an inverted-F antenna short-circuit path. Segments LBA and HBA may form low-band and high-band cellular telephone inverted-F antennas (as an example).

Gaps 18 separate respective portions of peripheral conductive housing member 16. Due to manufacturing variations, the structures associated with antennas 40U and 40L may not always be perfect. For example, during machining operations, small conductive filaments (metal burrs) may be produced within gap 18. These burrs may adversely affect antenna operation (e.g., by giving rise to inductances or other parasitic electrical characteristics that detune the antenna and/or reduce antenna efficiency at desired frequencies of operation).

As discussed previously, wireless over-the-air communications testing on completed devices such as device 10 may reveal the presence of wireless performance problems, but may not reveal whether or not these problems are due to burrs or other manufacturing defects and may not detect these problems at a sufficiently early stage in the manufacturing process. Manufacturing defects that degrade antenna performance are typically not be easily detected via visual inspection.

Figure 3A:
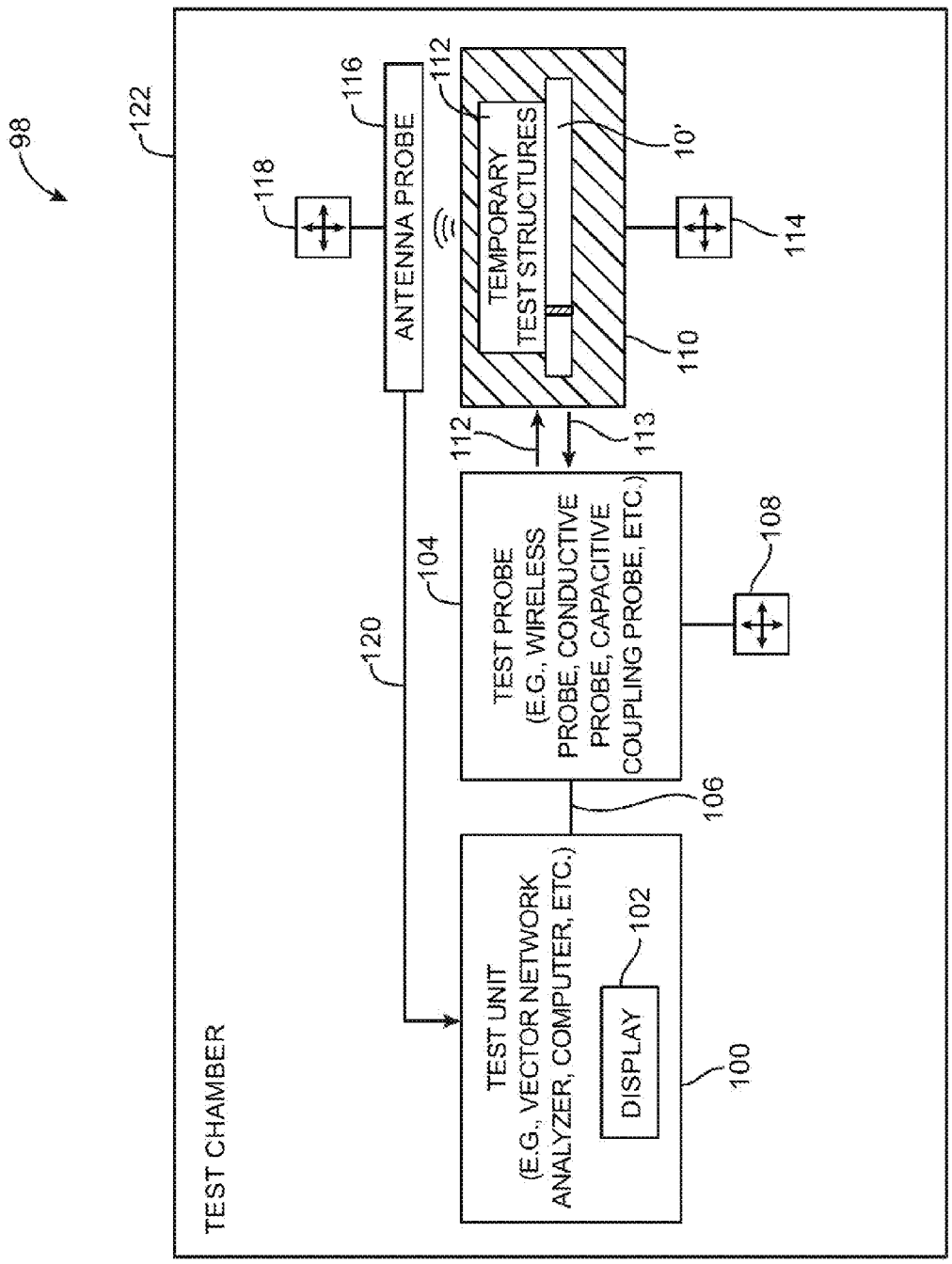
FIGS. 3A and 3B are diagrams of an illustrative test system environment in which electronic device structures may be tested using temporary test structures in accordance an embodiment of the present invention.

A test system of the type that may be used in testing electronic device structures such as peripheral conductive housing member 16 at a potentially earlier stage in the assembly process is shown in FIG. 3A. The electronic device structures being tested/calibrated may sometimes be referred to as device structures under test. The device structures under test may or may not resemble a partially assembled electronic device. In test system 98, test unit 100 may be used to perform radio-frequency tests on device structures under test 10'. Device structures under test 10' may include portions of a functional electronic device such as conductive housing structures, electronic components such as microphones, speakers, connectors, switches, printed circuit boards, antennas, parts of antennas such as antenna resonating elements and antenna ground structures, metal parts that are coupled to each other using welds, assemblies formed from two or more of these structures, or other suitable electronic device structures. These test structures may be associated with any suitable type of electronic device such as a cellular telephone, a portable computer, a music player, a tablet computer, a desktop computer, a display, a display that includes a built-in computer, a television, a set-top box, or other electronic equipment.

Test unit 100 may be coupled to one or more test probes such as test probe 104. Test probe 104 may be used to transmit radio-frequency signals 112 to device structures 10' and may be used to receive corresponding radio-frequency signals 113 reflected from device structures 10'.

Test probe 104 may be a wireless test probe (e.g., a non-contact antenna test probe), a wired test probe (e.g., a test probe having contact points configured to make physical contact with the device structures under test), a capacitive coupling test probe, or any suitable type of test probe that can be used to energize conductive antenna structures in device structures 10'.

During testing, a second test probe such as antenna probe 116 may be placed in the vicinity of device structures under test 10' for receiving radio-frequency signals radiated from device structures under test 10'. For example, antenna probe 116 may be placed within 10 cm or less of device structures under test 10', within 2 cm or less of device structures under test 10', or within 1 cm or less of device structures under test 10' (as examples). These distances may be sufficiently small to place antenna probe 116 within the "near field" of device structures under test 10' (i.e., a location at which signals are received by an antenna that is located within about one or two wavelengths from device structures under test 10' or less).

Device structures under test (DUT) 10' may be mounted in a test fixture such as test fixture 110 during testing. Test fixture 110 may contain a cavity that receives some or all of device structures under test 10'. Test fixture 110 may, if desired, be formed from dielectric materials such as plastic to avoid interference with radio-frequency test measurements. The relative position between test probe 104, antenna probe 116, and device structures under test 10' may be controlled manually by an operator of test system 98 or may be adjusted using computer-controlled or manually controlled positioners such as positioners 114, 118, and 114. Positioners 114, 108, and 118 may include actuators for controlling lateral and/or rotational movement of device structures under test 10', test probe 104, and/or antenna probe 116, respectively.

As shown in FIG. 3A, device structures under test 10' may be placed in an optional test chamber during test operations. Test chamber 122 may have radio-opaque walls (e.g., metal walls) to reduce electromagnetic interference.

Test unit 100 may include signal generator equipment that generates radio-frequency signals over a range of frequencies. These generated signals may be provided to test probe 104 over path 106 and may be transmitted towards device structures under test 10' as transmitted radio-frequency (RF) test signals 112. Path 106 may include, for example, a coaxial cable or, when multiple test probes are being used, may include multiple coaxial cables. Test unit 100 may also include radio-frequency receiver circuitry that is able to gather information on the magnitude and phase of corresponding received signals from device structures under test 10' (i.e., radio-frequency signals 113 that are reflected from device structures under test 10' and that are received using test probe 104).

With one suitable arrangement, test unit 100 may include a vector network analyzer (VNA), a spectrum analyzer, or other radio-frequency analyzer and a computer that is coupled to the vector network analyzer for gathering and processing test results. This is, however, merely illustrative. Test unit 100 may include any suitable computing equipment for generating radio-frequency test signals of desired frequencies while measuring and processing corresponding received signals.

By analyzing the transmitted and reflected signals, test unit 100 may obtain measurements such as S-parameter measurements that reveal information about whether the device structures under test are faulty. Test unit 100 may, for example, obtain an S11 (complex impedance) measurement and/or an S21 (complex forward transfer coefficient) measurement. The values of S11 and S21 (phase and magnitude) may be measured as a function of signal frequency.

Complex impedance measurements (S11 phase an magnitude data) on device structures 10' may be made by transmitting radio-frequency signals with test probe 104 and receiving corresponding reflected radio-frequency signals from device structures 10' using the same test probe 104. Complex forward transfer coefficient measurements (S21 phase and magnitude data) on device structures 10' may be made by transmitting radio-frequency signals with test probe 104 and receiving corresponding radio-frequency signals radiated from device structures under test 10' using a separate antenna test probe 116 (e.g., receiving the corresponding radiated radio-frequency signals via radio-frequency cable 120).

In situations in which device structures under test 10' are fault free, S11 and S21 measurements will have values that are relatively close to baseline measurements on fault-free structures (sometimes referred to as reference structures or a "gold" unit). In situations in which device structures under test 10' contain a fault that affects the electromagnetic properties of device structures under test 10', the S11 and S21 measurements will exceed normal tolerances. When test unit 100 determines that the S11 and/or S21 measurements have deviated from normal S11 and S21 measurements by more than predetermined limits, test unit 100 can alert an operator that device structures under test 10' likely contain a fault and/or other appropriate action can be taken. For example, an alert message may be displayed on display 102 of test unit 100. The faulty device structures under test 10' may then be repaired to correct the fault or may be scrapped.

With one suitable arrangement, an operator of system 98 may be alerted that device structures under test 10' have passed testing by displaying an alert message such as a green screen and/or the message "pass" on display 102. The operator may be alerted that device structures under test 10' have failed testing by displaying an alert message such as a green screen and/or the message "fail" on display 102 (as examples). If desired, S11 and/or S21 data can be gathered over limited frequency ranges that are known to be sensitive to the presence or absence of faults. This may allow data to be gathered rapidly (e.g., so that the operator may be provided with a "pass" or "fail" message within less than 30 seconds, as an example).

Test system 98 may be used to detect faults in conductive housing structures, faults associated with welds or solder joints between conductive structures, antenna structure faults, faults in conductive surfaces, faults in dielectric structures adjacent to conductive structures, faults in structures that include components that are electrically connected using springs or other contacts, or faults in other device structures under test 10'. Any fault that affects the electromagnetic properties of device structures under test 10' and therefore affects the measured S11 and/or S21 data that is gathered using test unit 20 may potentially be detected using test system 98.

Measuring S11 and/or S21 on partially assembled device structures under test 10' may sometimes fail in detecting certain types of manufacturing defects that manifest their negative impact on antenna performance in fully assembled devices (i.e., certain types faults are more detectable at later stages of production).

One way to enable detection of such types of manufacturing defects is to couple temporary test structures 112 (formed as part of test fixture 110) to device structures under test 10' during testing. The addition of temporary test structures 112 to device structures under test 10' may serve to make device structures 10' more sensitive to manufacturing defects so that the discrepancy between gathered test data for faulty device structures and satisfactory device structures are more pronounced (i.e., so that manufacturing defects can be more easily detected during early stages of production). Temporary test structures 112 may include structures that resemble device components that are normally part of an assembled device 10 (e.g., temporary test structures 112 may include structures that are configured to emulate radio-frequency characteristics associated with actual electronic device components that will be incorporated within assembled device 10 at later stages of production) and/or structures that are not normally part of assembled device 10. Test structures 112 may be temporarily attached to device structures under test 10' during radio-frequency testing/calibration and may be removed from device structures under test 10' upon completion of testing/calibration.

Test structures 112 that are used for magnifying antenna-related faults to allow for easier detection may include antenna subcomponents and auxiliary antenna components such as shorting pins, conductive elements attached to antenna member 16, or dielectric material (e.g., a dielectric member having any desired shape/dimension that serves no mechanical purpose in supporting device structures 10' in test fixture 110) in the near-field or far-field that influence the behavior of the antenna.

Figure 3B:
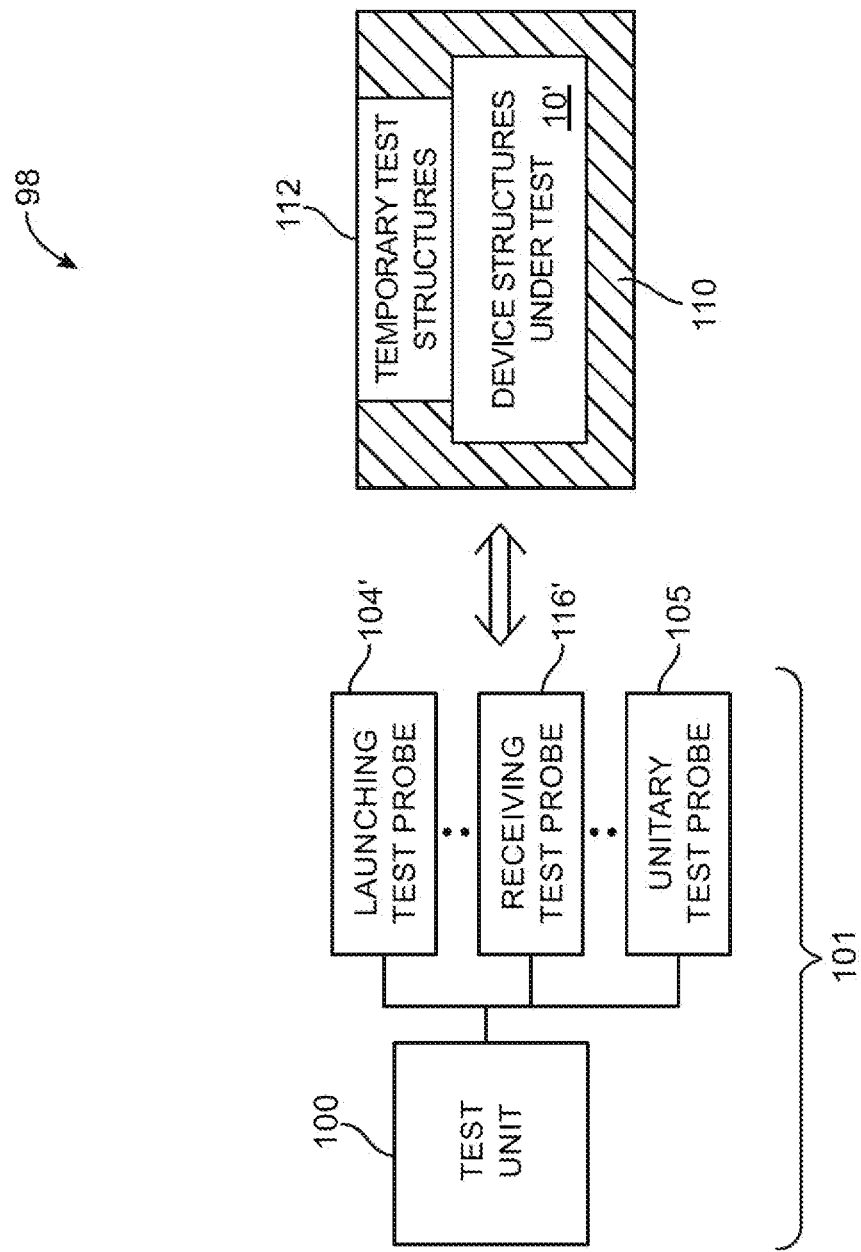

In general, test equipment 101 may include test unit 100 coupled to any number of launching test probe 104', receiving test probe 116', and/or unitary test probe 105 (see, e.g., FIG. 3B). Test probe 104', 116', and 105 may sometimes be referred to as test probe structures. Test probe 104' may be any type of test probe (e.g., a wired, wireless, or capacitive coupling test probe) configured to convey radio-frequency test signals to device structures under test 10', whereas test probe 116' may be any type of test probe configured to gather radio-frequency test data from device structures under test 10'. Unitary test probe 105 configured to transmit and receive radio-frequency test signals to and from device structures 10' may also be used, if desired.

Figure 4:
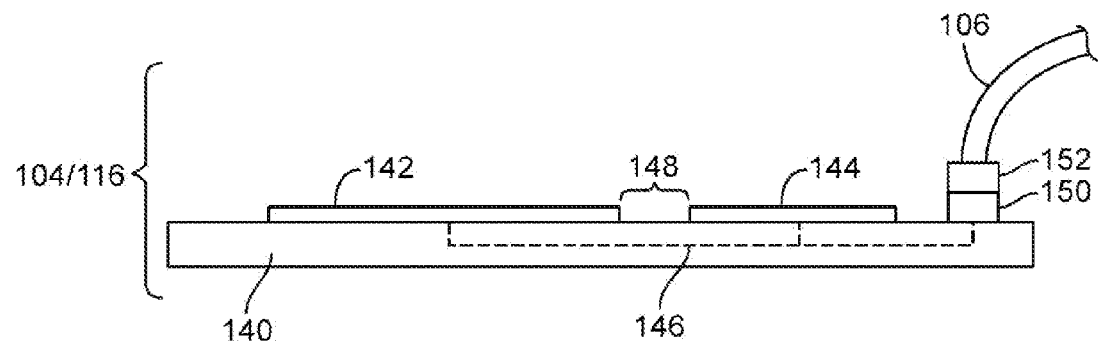
FIG. 4 is a side view of an illustrative antenna probe in accordance with an embodiment of the present invention.

FIG. 4 is a cross-sectional side view of an illustrative antenna probe of the type that may be used in test system 98 of the type shown in FIG. 3A. As shown in FIG. 4, antenna probe 116 (and optionally probe 104) may include a substrate such as substrate 140. Substrate 140 may be formed from a dielectric such as plastic, may be formed from a rigid printed circuit board substrate such as fiberglass-filled epoxy, may be formed from a flexible printed circuit ("flex circuit") substrate such as a sheet of polyimide, or may be formed from other dielectric substrate materials. Conductive antenna structures may be formed on substrate 140 to form one or more antennas. In the example of FIG. 4, antenna probe 116 includes conductive traces 142 and 144 formed on the surface of substrate 140. Traces 142 and 144 may be separated by a gap such as gap 148 and may form a dipole patch antenna. Conductive traces 146 supported by substrate 140 (e.g., one or more surface traces and/or buried metal traces) may be used in electrically coupling a connector such as coaxial cable connector 150 to traces 142 and 144. Connector 150 may receive a mating connector such as coaxial cable connector 152 on the end of coaxial cable 106, thereby coupling antenna probe 116 to test unit 100 (FIG. 3A).

Figure 5:
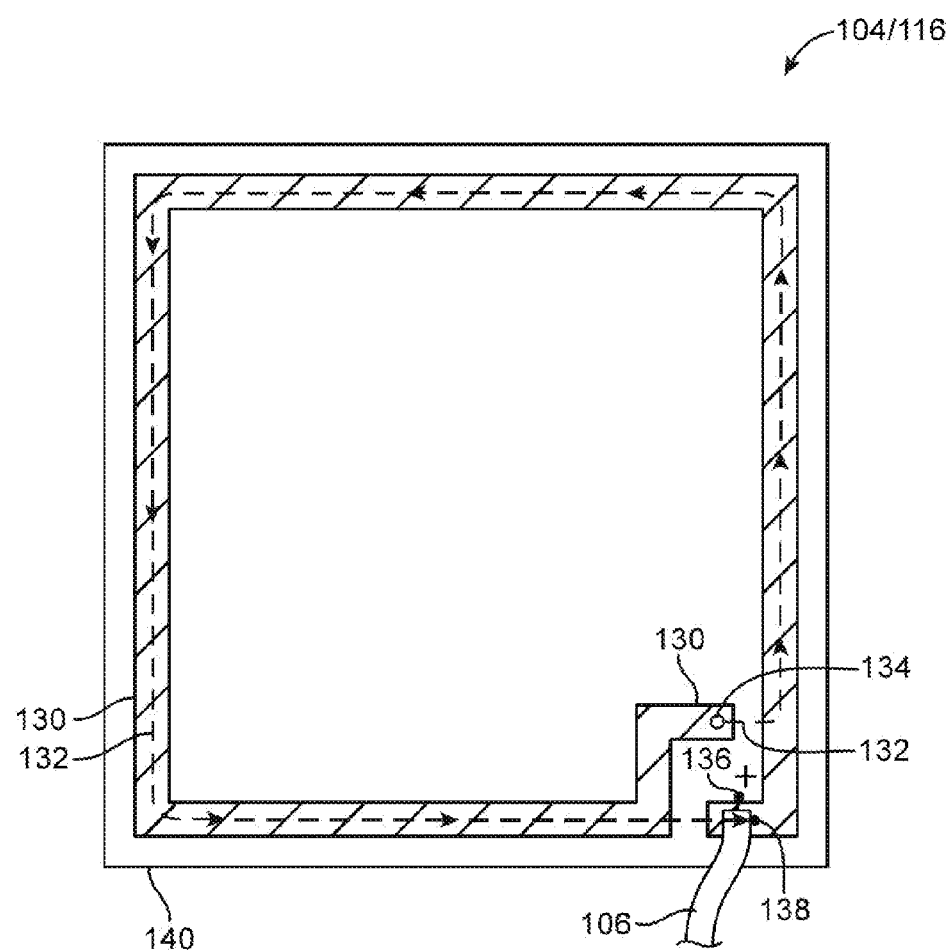
FIG. 5 is a top view of an illustrative wireless probe based on a loop antenna structure in accordance with an embodiment of the present invention.

In the example of FIG. 5, conductive traces 130 on substrate 140 have been used to form a loop antenna. Coaxial cable 106 (or other transmission line) may have a positive conductor coupled to positive antenna feed terminal 136 and a ground conductor coupled to ground antenna feed terminal 138. Positive antenna feed terminal 136 is coupled to upper conductive trace 130. Via 134 couples upper trace 130 to lower trace 132 (e.g., a trace on an opposing surface of a printed circuit board substrate or in a different layer of substrate 140). After looping around the periphery of substrate 140, lower trace 132 may be connected to ground feed terminal 138 by a via structure. The illustrative loop antenna of FIG. 5 uses two loops (upper and lower), but additional loops (e.g., three or more loops) or fewer loops (e.g., a single loop) may be used in antenna probe 116 if desired.

In general, antenna probes 116 (sometimes referred to as a wireless probe or a non-contact probe) may include any suitable type of antenna (e.g., a patch antenna, a loop antenna, a monopole antenna, a dipole antenna, an inverted-F antenna, an open or closed slot antenna, a planar inverted-F antenna, open-ended waveguides, horn antennas, coil antennas, etc.).

Figure 6:
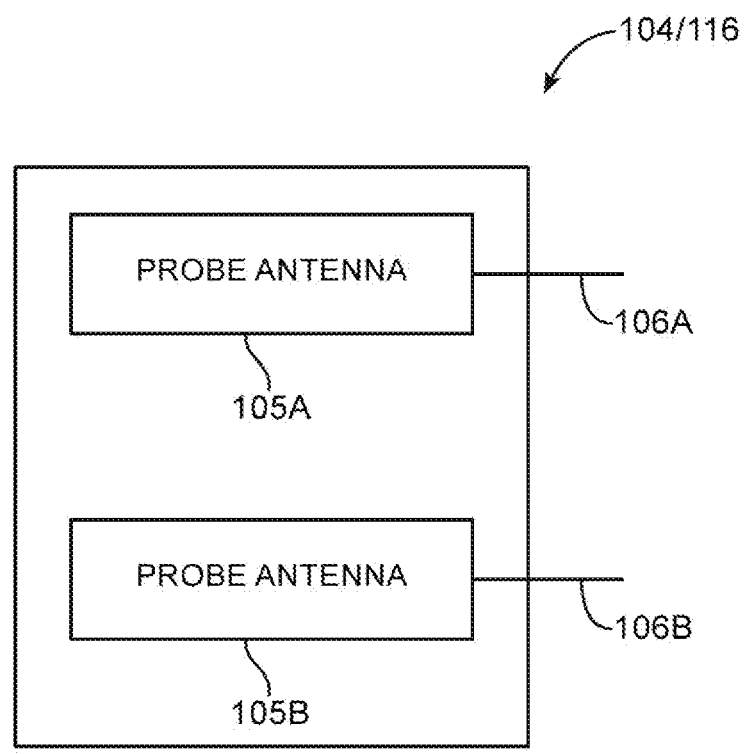
FIG. 6 is a top view of an illustrative wireless probe structure having two probe antennas that are configured to test a device of the type shown in FIG. 2 in accordance with an embodiment of the present invention.

When testing device structures under test such as device structures 10' having more than one antenna, it may be desirable to provide antenna probe 116 with multiple antennas each of which corresponds to a respective one of the antennas (40U, 40L) or other structures to be tested. An illustrative antenna probe that includes two antennas 105A and 105BB for testing structures 40U and 40L in device structures under test 10' is shown in FIG. 6. As shown in FIG. 6, antenna probe 116 may include first probe antenna 105A (e.g., a first dipole patch antenna of the type shown in FIG. 4, a first loop antenna of the type shown in FIG. 5, or an antenna of another suitable type) and second probe antenna 105B (e.g., a second dipole patch antenna of the type shown in FIG. 4, a second loop antenna of the type shown in FIG. 5, or an antenna of another suitable type). Test unit 100 may be coupled to antennas using transmission line paths 106A and 106B. If desired, paths 106A and 106B may be coupled to a single vector network analyzer port using a signal combiner, paths 106A and 106B may be coupled to separate ports in one or more vector network analyzers or other suitable test equipment, and one or more radio-frequency switches may be used in conjunction with combiners or other radio-frequency components to interconnect one or more vector network analyzer ports to one or more different paths such as paths 106A and 106B.

During testing of device structures under test 10', antenna probe 116 may be placed in the vicinity of device structures under test 10' so that probe antenna 105A is aligned with antenna 40U and so that probe antenna 105B is aligned with antenna 40L. If desired, probe antenna 116 may be provided with additional antennas. For example, if there are three or more antennas or other structures to be wirelessly tested in device structures under test 10', antenna probe 116 may be provided with three or more corresponding test antennas.

Figure 7:
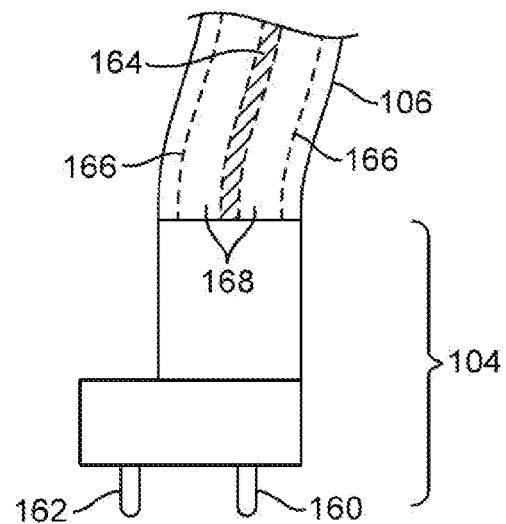
FIG. 7 is a diagram of an illustrative test probe configured to make physical contact with device structures under test in accordance with an embodiment of the present invention.

Test probe 104 may be implemented as an antenna probe as described in connection with FIGS. 4-6. In another suitable arrangement, test probe 104 may be implemented as a wired test probe configured to make physical contact with device structures under test 10'. FIG. 7 shows an exemplary wired test probe 104 that includes a conductive signal pin 160 and a conductive ground pin 162. At least one of pins 160 and 162 may be spring-loaded to provided improved mate-ability for test probe 104 during testing.

As shown in FIG. 7, radio-frequency cable 106 may be a coaxial cable having an inner signal conductor 164 surrounded by a ground shielding layer 166. Dielectric material 168 may be interposed between inner signal conductor 164 and ground shielding layer 166. Signal conductor 164 may be electrically connected to signal pin 160, whereas ground shielding layer 166 may be electrically connected to ground pin 162. During testing, signal pin 160 may be placed into contact with a portion of peripheral conductive member 16, whereas ground pin 162 may be placed into contact with a portion of midplate 58 (as an example). If desired, contact probe 104 of FIG. 7 may be used to make contact with any desired region on device structures under test 10'. If desired, contact probe 104 may be an RF connector (e.g., a SubMiniature version A connector, a mini U.FL connector, etc.).

Figure 8:
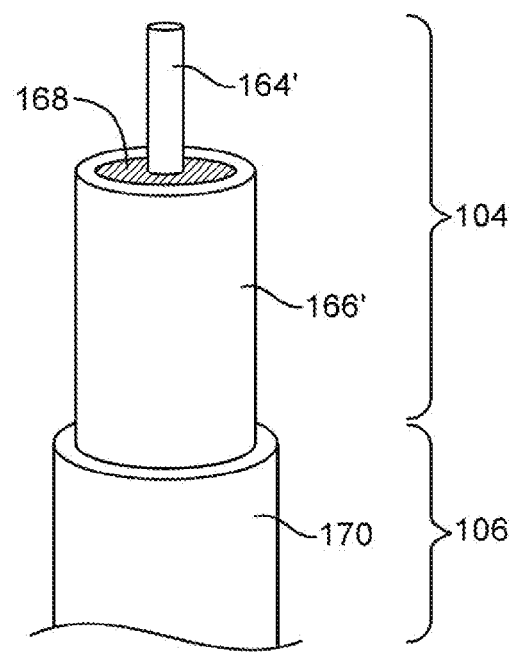
FIG. 8 is a diagram of an illustrative radio-frequency cable configured to convey radio-frequency test signals to device structures under test in accordance with an embodiment of the present invention.

In another suitable arrangement, a stripped portion of coaxial cable 106 may be used a wired test probe 104 (see, e.g., FIG. 8). As shown in FIG. 8, an exposed portion of ground shielding layer 166' may not be covered with rubber coating 170. Moreover, a protruding portion of inner signal conductor 164' may not be covered with insulating material 168. During testing, protruding signal conductor 164' may make electrical contact with a portion of peripheral conductive member 16 (via a spring, screw, or other suitable types of conductive coupling mechanism), whereas exposed ground shielding layer portion 166' may be shorted to a portion of midplate 58 (via conductive foam material, conductive adhesive, or other suitable conductive materials). If desired, contact probe 104 of FIG. 8 may be used to feed radio-frequency test signals to any part of device structures under test 10'.

Figure 9A:
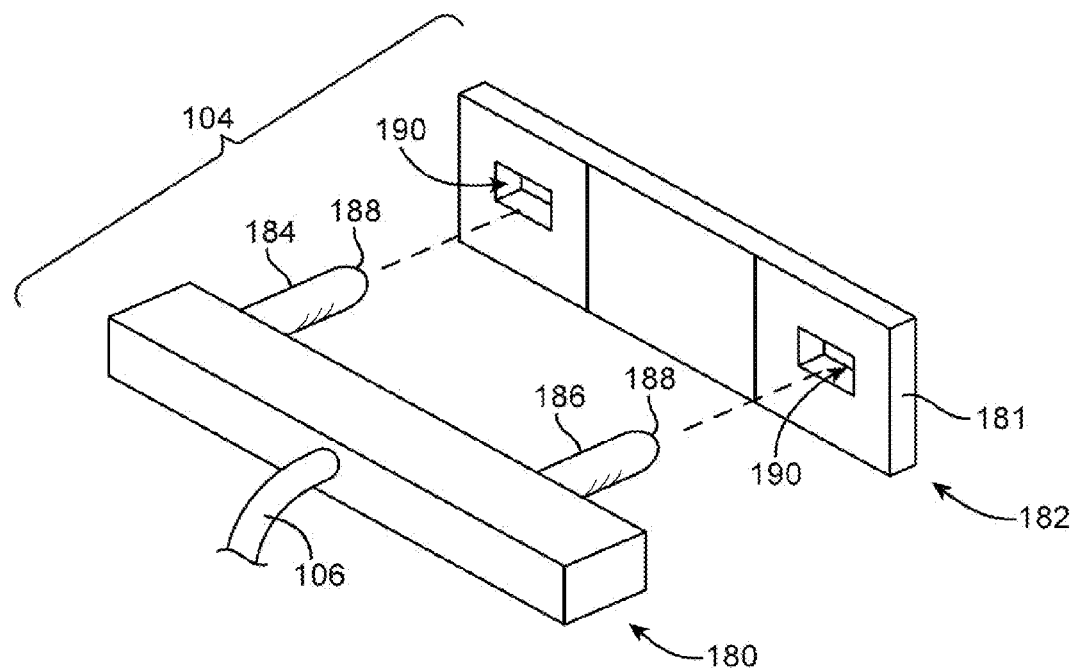
FIG. 9A is an exploded perspective view of a capacitive coupling probe and an associated probe with mating spring-loaded pins in accordance with an embodiment of the present invention.

In another suitable arrangement, test probe 104 may include a capacitive coupling probe 182 and wired probe 180 (FIG. 7). As shown in the exploded perspective view of FIG. 9A, probe 180 may include contacts such as signal and ground pins 184 and 186. Probe 182 may have a dielectric substrate such as a flex circuit substrate 181. Openings such as openings 190 may be used to expose contact pads in probe 182 (i.e., contact pads that allow gold-plated tips 188 of pins 184 and 186 to electrically connect with respective pads in probe 182). During testing, probe 182 may be placed against the outer surface of member 16 to capacitively couple probe 182 to member 16.

Figure 9B:
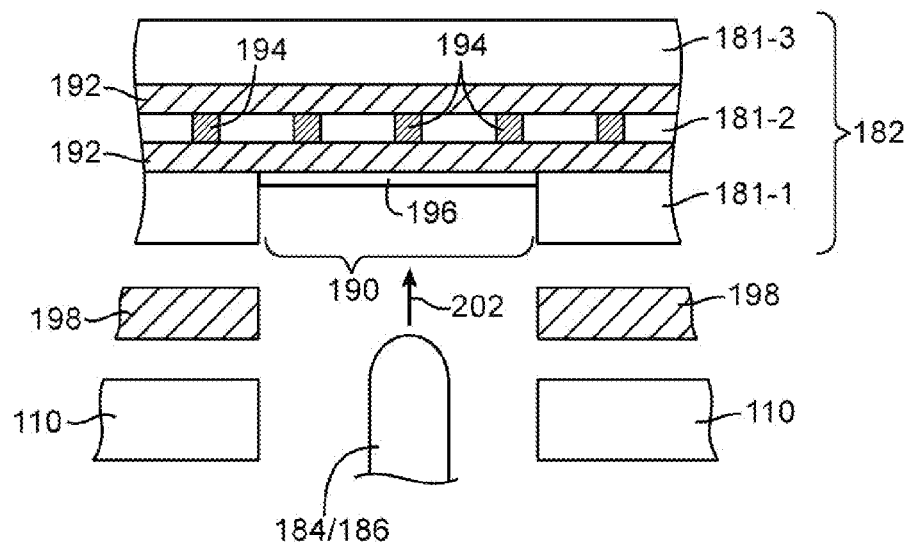
FIG. 9B is a cross-sectional top view of the capacitive coupling probe of FIG. 9A in accordance with an embodiment of the present invention.

FIG. 9B contains a cross-sectional top view of probe 182. As shown in FIG. 9B, the dielectric substrate of probe 182 may include one or more layers such as layers 181-1, 181-2, and 181-3. Layers 181-1, 181-2, and 181-3 may be polymer layers (sub-layers) such as layers of polyimide in a flex circuit layer. Layer 181-3 may have a thickness of about 20-30 microns (as an example). Layers 181-2 and 181-1 may have thicknesses of about 20-70 microns (as an example). One or more metal layers such as metal layers 192 may be patterned to form pads for probe 182. In configurations with multiple metal layers, intervening vias such as metal vias 194 may be used to short the metal layers together to form unitary pad structures. Opening 190 in outermost polymer layer 181-1 may be used to allow contact with pins 184 and 186 when pins 184 and 186 are moved in direction 202 by biasing structures 108.

Test measurement accuracy may be enhanced by ensuring that probe 100 is placed in firm contact with the outer surface of member 16. This helps ensure that the distance between metal 192 and member 16 is uniform and is dictated by the known thickness of dielectric layer 181-3. With one suitable biasing arrangement, which may be helpful when biasing probe 182 against a curved portion of member 16, a compressible elastomeric substance such as polymer foam 198 may be interposed between the wall of test fixture 110 and probe 182 (e.g., capacitive coupling test probes 182 may be attached to the inner walls of the test cavity in which device structures under test 10' are inserted during testing). When device structures under test 10' are placed within test fixture 110, foam 198 will be compressed and will bias probe 181 in direction 202 towards the outer surface of member 16. If desired, other biasing structures may be used between probe 182 and the inner surface of test fixture 110 (e.g., springs, spring-based and actuator-based pushing mechanisms, levers, etc.). The biasing structures may be formed from plastic, metal, other materials, combination of these materials, etc. The use of a foam biasing member is merely illustrative.

As described in connection with FIGS. 4-9, test probe 104 can be any suitable test equipment configured to energize device structures under test 10' (i.e., any suitable type of radio-frequency conduit through which radio-frequency test signals may be fed to device structures under test 10'). The exemplary test probes of FIGS. 4-9 are merely illustrate and are not intended to limit the scope of the present invention.

Figure 10:
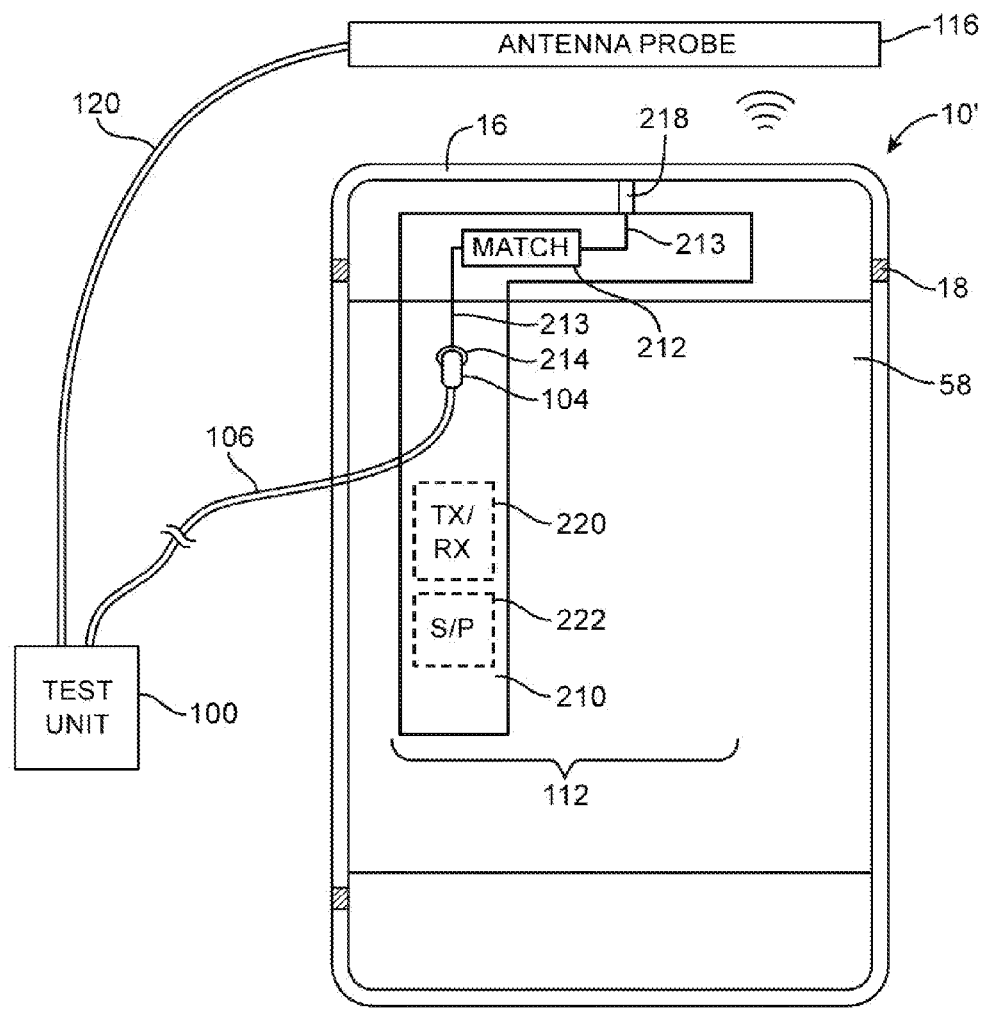
FIG. 10 is a diagram of electronic device structures being tested with a temporary printed circuit board in accordance with an embodiment of the present invention.

FIG. 10 shows one illustrative arrangement in which device structures under test 10' are tested using temporary test structures 112. As shown in FIG. 10, device structures under test 10' may include at least peripheral conductive housing member 16 and midplate 58, representing a substantially unassembled electronic device in an early stage of production.

Temporary test structures 112 may include a printed circuit board (PCB) for test 210, a radio-frequency connector 214 mounted on PCB 210, a transmission line path 213 formed in PCB 210, and an impedance matching circuit 212 formed on PCG 210. Transmission line path 213 may have a first end that is connected to radio-frequency connector 214 and a second end that is coupled to a portion of antenna structure 16 via coupling member 218 (e.g., via a spring, screw, conductive foam material, or other suitable coupling mechanism). Impedance matching circuit 212 may be interposed in transmission line path 213 between the first and second end of path 213.

PCB 210 and its associated circuitry (i.e., radio-frequency connector 214, transmission line path 213, impedance matching circuit 212, coupling member 218, etc.) may resemble components that are actually assembled as part of device 10 during later stages of production. As examples, PCB 210 may have the same shape and properties as the main logic board (MLB) that will later be mounted within device 10, transmission line path 213 may have the same length and properties as the actual transmission line path formed on the actual MLB, connector 213 may be mounted at a location on PCB 210 that corresponds to the same location that a switch connector is to be mounted on the MLB, etc. If desired, temporary test structures 112 may also include transceiver circuitry 220, storage and processing circuitry 222 (e.g., transceiver circuitry and/or storage and processing circuitry that are identical, similar, or substantially different versions of the wireless and processing circuitry that will be mounted within device 10 during later stages of production), surface-mount resistors, capacitors, inductors, and/or other electrical components mounted on PCB 210 so that temporary test structures 112 emulate the electromagnetic properties of the wireless circuitry on the actual MLB as closely as possible during testing or so that temporary test structures 112 help accentuate differences in test results gathered from faulty and satisfactory devices 10'.

In the exemplary test setup of FIG. 10, test probe 104 (e.g., a radio-frequency connector) may be mated to connector 214 so that radio-frequency test signals may be transmitted from test unit 100 to member 16 via transmission line path 213. Reflected signal received through test probe 104 can be used to obtain S11 parameters, whereas radiated signals received using antenna probe 116 may be used to obtain S21 parameters (as an example). Upon completion of testing, temporary test structures 112 may be removed from device structures under test 10' and may be used to test other device structures in the production line. PCB 210 that is used for testing and that includes replica wireless circuitry may sometimes be referred to as a dummy test MLB.

Figure 11:
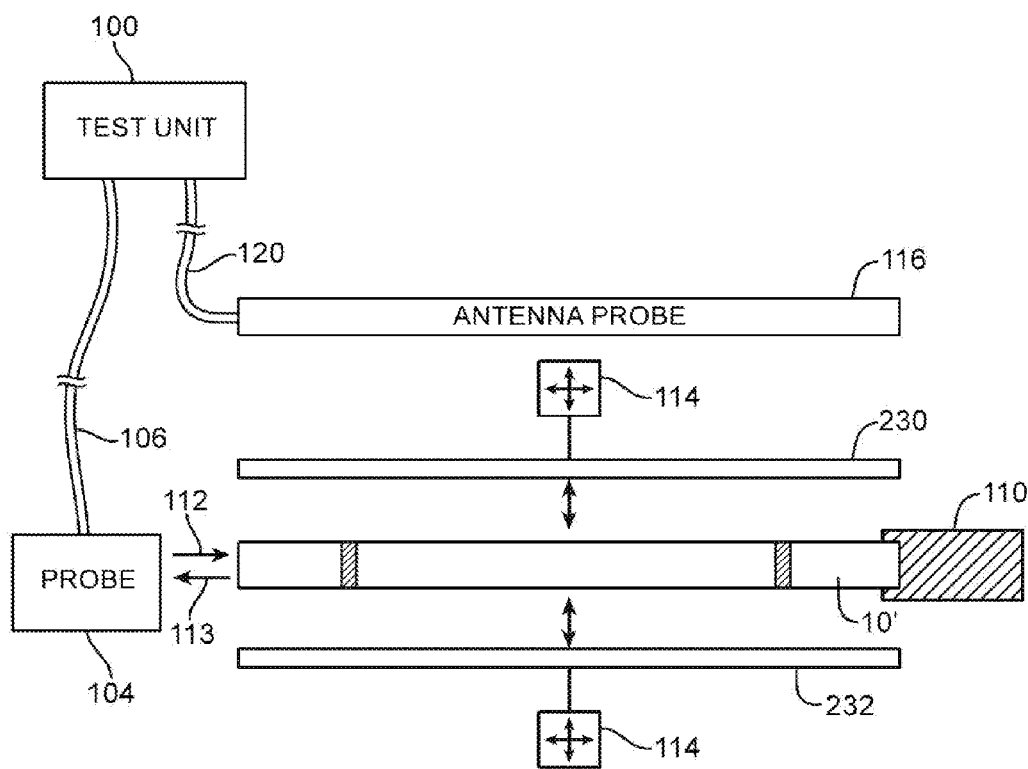
FIG. 11 is a diagram of electronic device structures being tested with temporary housing structures in accordance with an embodiment of the present invention.

In another suitable arrangement of the present invention, test structures 112 may include first cover glass layer 230 and second cover glass layer 232 each of which is temporarily fitted to device structures under test 10' during testing. As shown in FIG. 11, device structures under test 10' may be secured to test fixture 110 while positioners 114 fit cover glass layers 230 and 232 within the inner surface of peripheral conductive housing member 16 (e.g., cover glass layers 230 and 232 may be temporarily placed against at least a portion of member 16). Cover glass layers 230 and 232 may resemble actual cover glass material that is secured to midplate 58 during final stages of production (e.g., cover glass layers 230 and 232 may have the same dimension and properties as the actual cover glass material that is assembled as the outer housing of device 10 at later stages of production). Cover glass layers 230 and 232 need not be firmly secured (e.g., screwed or glued) to device structures under test 10' during testing. In general, temporary test structures 112 that configured device structures under test 10' to temporarily resemble more complete electronic devices may include other electrical components such as conductive housing structures, electronic components such as microphones, speakers, connectors, switches, printed circuit boards, antennas, parts of antennas such as antenna resonating elements and antenna ground structures, metal parts that are coupled to each other using welds, assemblies formed from two or more of these structures, or other suitable electronic device structures.

In the exemplary test setup of FIG. 11, test probe 104 may be used to energize the antenna structures (e.g., through means of wireless transmission, direct contact, capacitive coupling, etc.) so that radio-frequency test signals 112 may be transmitted from test unit 100 to member 16. Reflected signals 113 received through test probe 104 can be used to obtain S11 parameters, whereas corresponding radiated signals received using antenna probe 116 may be used to obtain S21 parameters. Upon completion of testing, temporary test structures 112 may be removed from device structures under test 10' (e.g., positioners 114 may detach cover glass material 230 and 232 from device structures under test 10') and may be used to test other device structures in the production line.

The examples of FIGS. 10 and 11 are merely illustrative and are not intended to limit the scope of the present invention. If desired, other test structures that resemble any conductive or nonconductive component in the finished product may be temporarily placed in contact with or in the vicinity of device structures under test 10' during test operations.

Figure 12A:
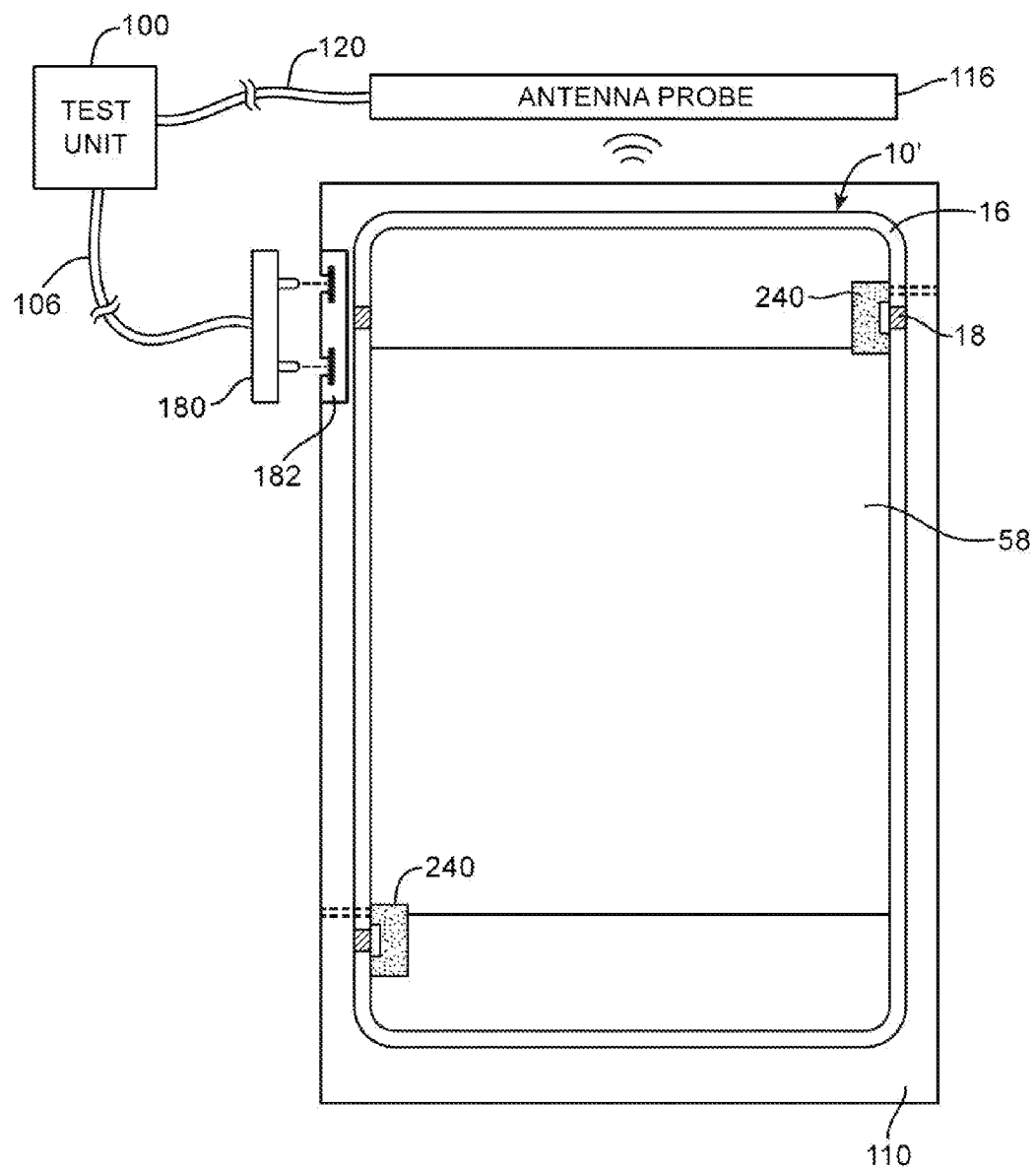
FIG. 12A is a diagram of electronic device structures of the type shown in connection with FIG. 2 being tested with temporary gap bridging members configured to short at least one gap in the peripheral conductive housing member in accordance with an embodiment of the present invention.

Temporary test structures that are not normally part of device 10 may also be used during testing to increase the sensitivity of device structures under test 10' to manufacturing defects. As shown in FIG. 12A, the temporary test structures may include conductive gap bridging members such as gap bridging members 240. For example, capacitive test probe 182 may be used to measure the capacitance of a selected one of gaps 18 while the other gaps 18 are shorted out using members 240. Capacitive coupling probe 182 may also be used to feed radio-frequency test signals to peripheral conductive member 16.

Figure 12B:
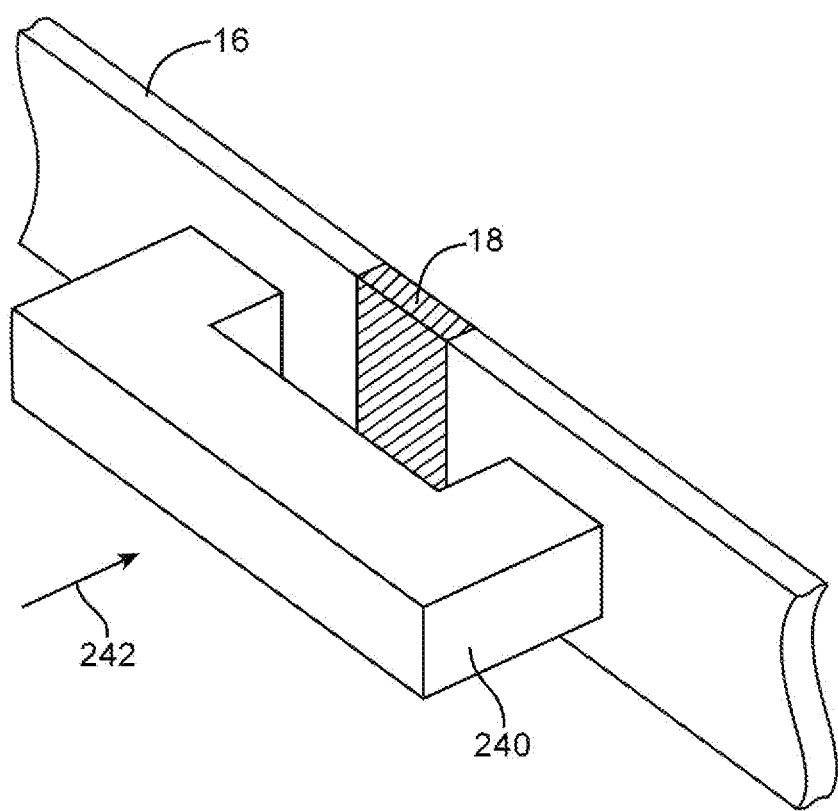
FIG. 12B is a perspective view of the temporary bridging structure of FIG. 12A in accordance with an embodiment of the present invention.

Members 240 may be conductive structures that serve to short the opposing ends of gaps 18 (see, e.g., FIG. 12B). When device structures under test 10' are placed into test fixture 110, members 240 may be moved in the direction of arrow 242 so that members 240 are firmly placed in contact with the inner surface of peripheral conductive housing member 16. Members 240 may be formed using aluminum, stainless steel, or any other suitable conductive material. Shorting gaps 18 in this way may effectively increase the accuracy of the measured capacitance using capacitive probe 182 or increase the chance of detecting a manufacturing defect within gap 18 (e.g., metal burs in gap 18). If desired, member 16 may also be energized using a wireless probe (FIGS. 4-6) or a wired probe (FIGS. 7 and 8).

Reflected signals received through test probe 180 can be used to obtain S11 parameters, whereas radiated signals received using antenna probe 116 may be used to obtain S21 parameters. Upon completion of testing, the temporary test structures may be removed from device structures under test 10' (e.g., members 240 are decoupled from gaps 18) and other device structures in the production line may be placed in test fixture 110 for testing the presence of defects.

Figure 13:
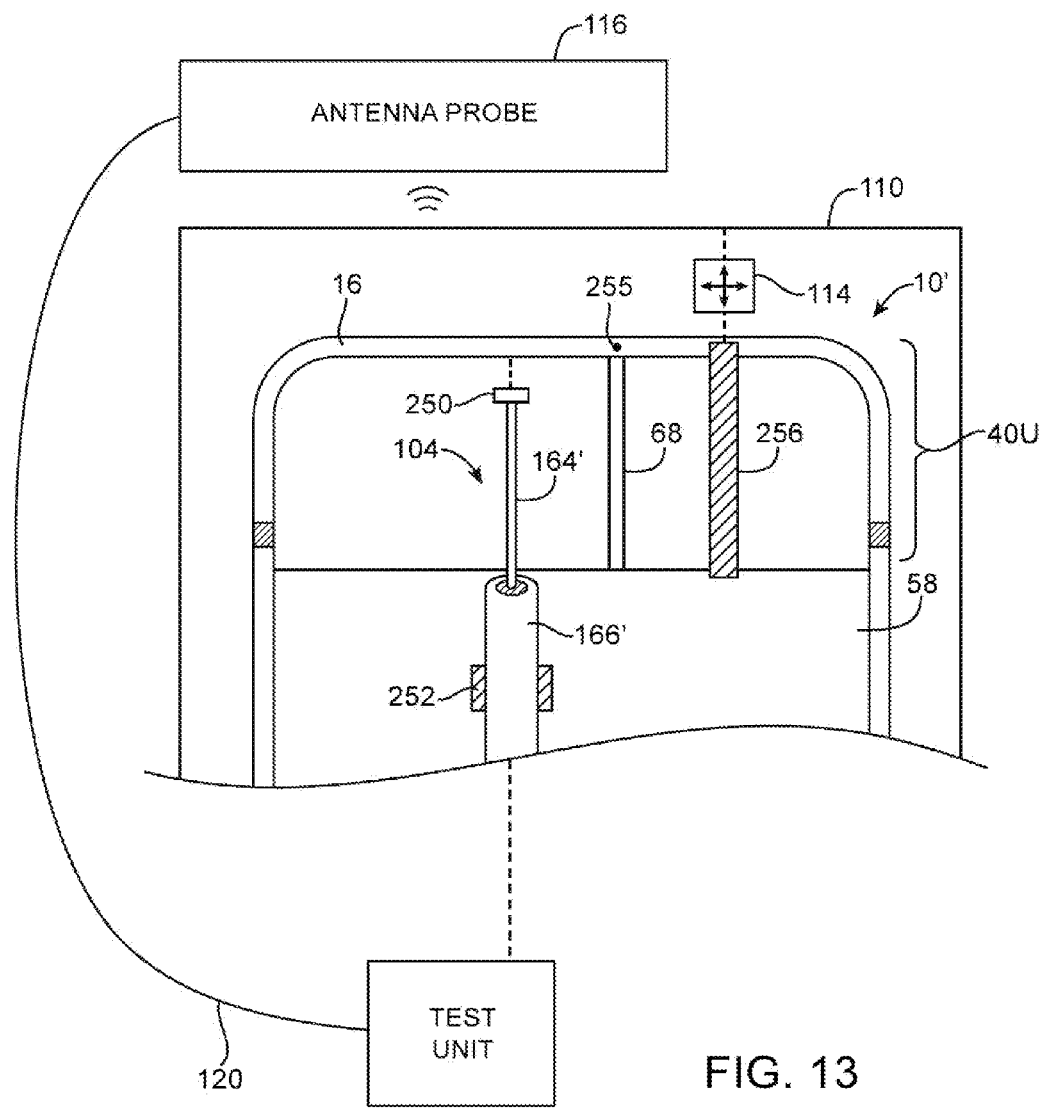
FIG. 13 is a diagram of electronic device structures being tested with a temporary antenna shorting conductor in accordance with an embodiment of the present invention.

FIG. 13 shows another suitable test arrangement in which the temporary test structures include a shorting conductor 256 that is configured to short midplate 58 with a corresponding portion of conductive housing member 16. As shown in FIG. 13, device structures under test 10' may include peripheral conductive member 16, grounding midplate 58 secured within member 16, and short-circuit member 68 coupled between midplate 58 and corresponding point 255 on member 16 (see, e.g., FIG. 2). Short-circuit member 68 may be part of a finished device 10.

Temporary shorting conductor 256 may be placed at any desired location along midplate 58 as long as conductor 256 is coupled in parallel with shorting member 68. Positioner 114 may be configured to place conductor 256 at a location along midplate 58 that maximizes the difference between the antenna performance of a fault-free device and the antenna performance of a faulty device.

A wired test probe of the type described in connection with FIG. 8 may be used to energize antenna structure 16. In the example of FIG. 13, a coupling member such as coupling member 250 may be connected to the tip of signal conductor 164' so that member 250 may be placed in contact with member 16 during testing. Grounding portion 166' of conducted test probe 104 may be shorted to midplate via conductive foam material 252 (as an example). If desired, antenna structure 16 may be energized using wireless or capacitive coupling test probes.

Reflected radio-frequency signals received through test probe 104 can be used to obtain S11 parameters, whereas corresponding radiated signals received using antenna probe 116 may be used to obtain S21 parameters. Upon completion of testing, the temporary test structures may be removed from device structures under test 10' (e.g., conductor 256 and test probe 104 may be decoupled from device structures under test 10').

Figure 14:
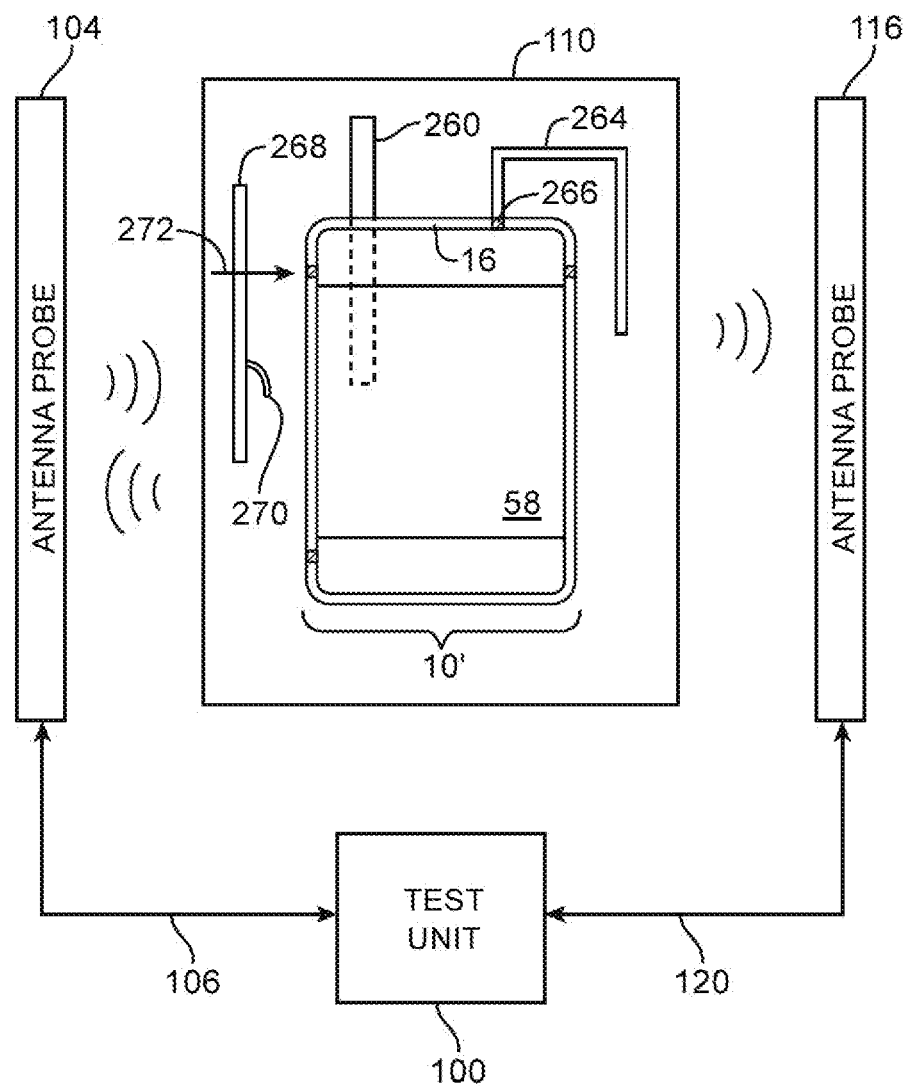
FIG. 14 is a diagram of electronic device structures of the type shown in connection with FIG. 2 being tested with conductive structures temporarily coupled to the peripheral conductive housing member in accordance with an embodiment of the present invention.

In general, any number of temporary test structures may be coupled to device structures under test 10' during testing to enhance the detectability of manufacturing defects during early stages of production. FIG. 14 is a diagram showing different types of conductive structures that may be attached to peripheral conductive member 16. For example, while device structures under test 10' is placed in test fixture 110, conductive tape 260 may be attached to test fixture 110 in close vicinity to (but not in direct contact with) member 16, metal strip 268 may make contact with member 16 via spring member 270 (by moving strip 268 in direction 272), and flex circuit 264 may be attached to member 16 at location 266 (see, e.g., FIG. 14). These examples are merely illustrative. If desired, any conductive or nonconductive (dielectric) material, radio-frequency cables, surface-mount components such as resistors, capacitors, and inductors, and other electrical components that may affect the near-field and far-field antenna properties of device 10 may be temporarily placed in the vicinity of or in physical contact with device structures under test 10' during test operations.

In the example of FIG. 14, antenna probe 104 is used to energize device structures under test 10'. If desired, device structures under test 10' may be provided with radio-frequency test signals using wired test probes, capacitive coupling test probes, or any other suitable type of radio-frequency test probes.

Figure 15:
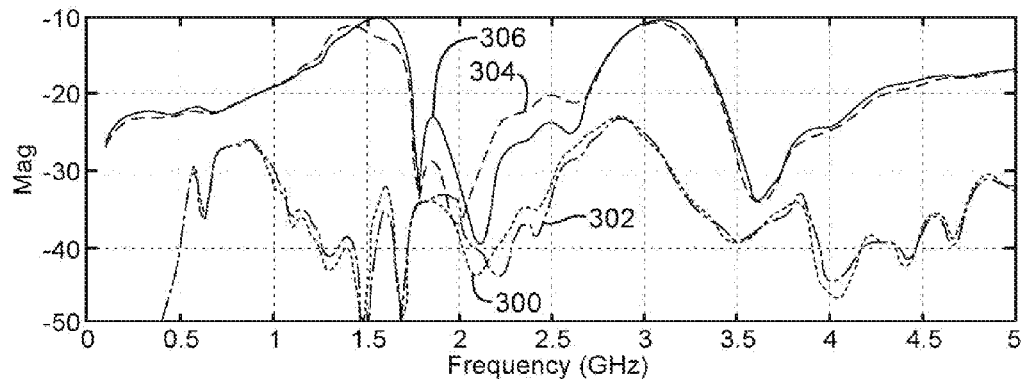
FIG. 15 is a graph of illustrative impedance magnitude data of the type that may be gathered using a test system in accordance with an embodiment of the present invention.
Figure 16:
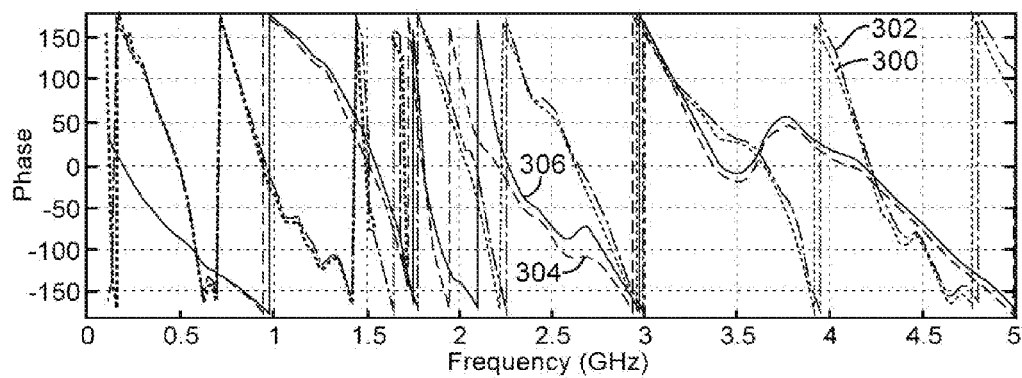
FIG. 16 is a graph of illustrative impedance phase data of the type that may be gathered using a test system in accordance with an embodiment of the present invention.

Illustrative test data gathered using test system 98 is shown in FIGS. 15 and 16. In FIG. 15, the magnitude of forward transfer coefficient S21 has been plotted as a function of test signal frequency for a frequency range of 0 to 5 GHz. In FIG. 16, the phase of forward transfer coefficient S21 has been plotted as a function of test signal frequency for a frequency range of 0 to 5 GHz.

There are four curves in the graphs of FIGS. 15 and 16. Curve 300 corresponds to data for device structures under test that include one or more manufacturing defects (e.g., peripheral conductive member 16 having ill-formed gaps, non-uniform thickness, etc.); curve 302 corresponds to reference data for satisfactory device structures under test without any manufacturing defects; curve 304 corresponds to data for faulty device structures under test that is tested using temporary test structures 112 (of the type described in connection with FIGS. 10-14); and curve 306 corresponds to reference data for satisfactory device structures under test that is tested with temporary test structures 112.

Figure 17:
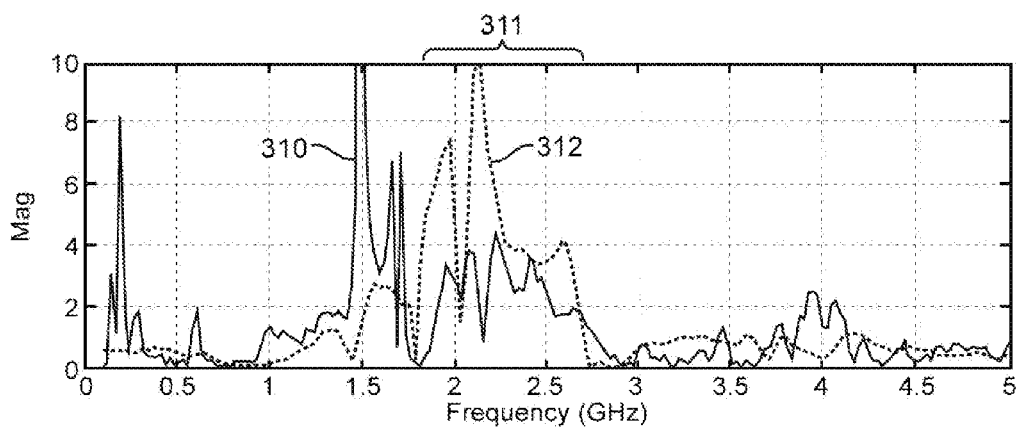
FIG. 17 is a graph of illustrative impedance magnitude difference data of the type that may be gathered using a test system in accordance with an embodiment of the present invention.
Figure 18:
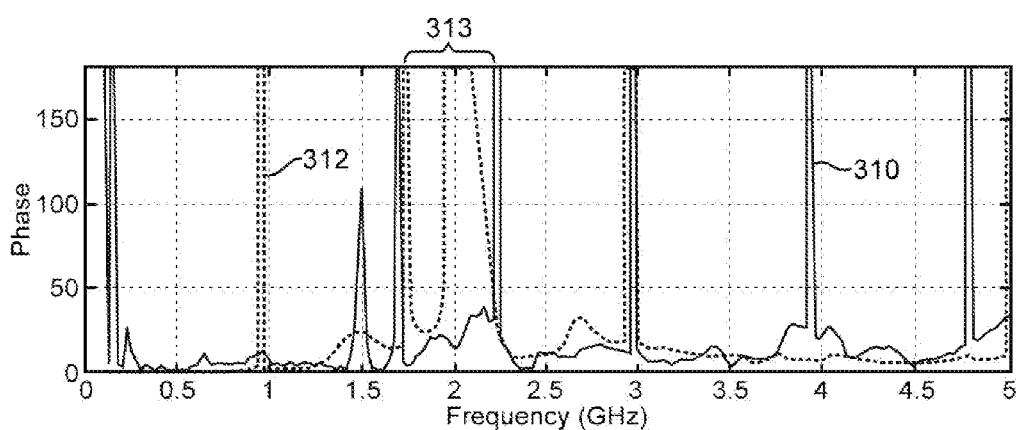
FIG. 18 is a graph of illustrative impedance phase difference data of the type that may be gathered using a test system in accordance with an embodiment of the present invention.

The discrepancy in the magnitude and phase of S21 gathered from faulty and satisfactory device structures under test that are testing without using temporary test structures 112 is plotted as curve 310 in FIGS. 17 and 18. The discrepancy in the magnitude and phase of S21 gathered from faulty and satisfactory device structures under test that are testing with temporary test structures 112 is plotted as curve 312 in FIGS. 17 and 18.

As indicated by illustrative frequency ranges 311 and 313 in FIGS. 17 and 18, respectively, there are portions of these graphs in which the discrepancy between the faulty and fault-free versions of the test data is substantially more pronounced when DUT 10' is tested in the presence of temporary test structures 112. Other frequency ranges may be investigated if desired (e.g. a range of frequencies covering 1 to 5 GHz, a range of frequencies including frequencies between 2 and 4 GHz, etc.). Monitoring the discrepancy between the expected (reference) and measured values of the S21 test data (or S11 test data or other test data measured using test system 98) while the temporary test structures are coupled to the device structures under test may facilitate in more effectively identifying conductive electronic device structures that contain faults.

Figure 19:
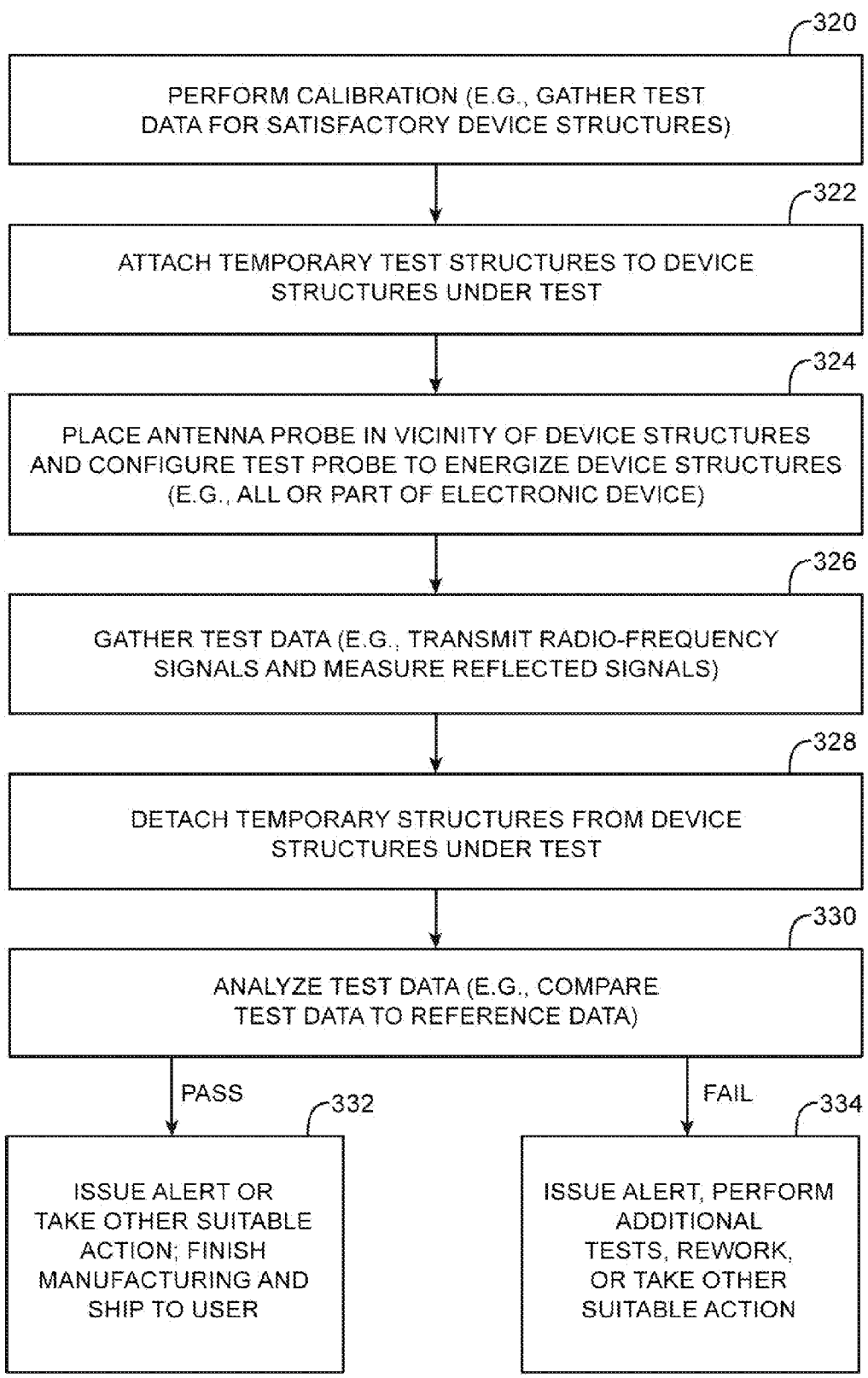
FIG. 19 is a flow chart of illustrative steps involved in testing electronic device structures using a test system of the type shown in FIG. 3A in accordance with an embodiment of the present invention.

Illustrative steps involved in testing device structures under test 10' using a test system of the type shown in FIG. 3A are shown in FIG. 19.

At step 320, a test system operator may place one or more versions of electronic device structures under test 10' that have known satisfactory characteristics in test fixture 110 and may gather corresponding test results while temporary test structures 112 are coupled to device structures 10'. For example, reflection coefficient measurements (magnitude and/or phase) and/or forward transfer coefficient measurements (magnitude and/or phase) may be obtained over a range of frequencies, as described in connection with FIGS. 15 and 16. The structures that are measured in this way may include substantially perfect (fault-free) structures and/or structures that exhibit acceptable manufacturing variations. For example, the structures that are measured may be members 16 that include gaps 18 that do contain manufacturing faults such as burrs. The test measurement data that is gathered during the operations of step 320 may be stored in test equipment 100 to serve as baseline data (sometimes referred to as reference data or calibration data) to which subsequent test data may be compared when testing device structures of unknown quality during manufacturing.

After gathering baseline data on device structures with known characteristics (e.g., device structures that are known to be fault free) during the operations of step 320, device structures may be tested in a production environment. In particular, during the operations of steps 322 and 324, a test system operator may repeatedly place device structures under test 10' into test fixture 110 so that test probe 104 can feed radio-frequency test signals to portions of member 16 or other conductive portions of device structures under test 10' and so that temporary test structures 112 are placed in the vicinity of or in direct contact with portions of member 16 or other antenna structures in device structures under test 10'.

During the operations of step 326, test data may be gathered on those structures. When gathering test data during the operations of step 326, test equipment 100 may transmit radio-frequency signals via probe 104. While transmitting radio-frequency signals via probe 104, test equipment 100 may receive reflected radio-frequency signals via cable 106 (for measuring reflection coefficient data) and may wirelessly receive radio-frequency signals using test antenna 116 (for measuring forward transfer coefficient data). The transmitted and received signals may be processed (e.g., to compute magnitude and phase S11 and S21 data to determine whether filaments or other manufacturing defects are present in structures 10').

At step 328, temporary test structures 112 may be detached from device structures under test 10' and device structures under test 10' may be removed from test fixture 110 to test additional device structures.

At step 330, the test data that has been gathered from the device structures under test may be compared to the reference data that was collected during the calibration operations of step 320. In particular, the test data may be evaluated to determine whether or not the test data deviates by more than an acceptable amount from the baseline data gathered during the operations of step 320.

In response to a determination that the test data is within acceptable limits (i.e., if the discrepancy levels of FIGS. 18 and 19 are less than a predetermined threshold), test equipment 100 may issue a corresponding alert to the test system operator (e.g., by displaying a "pass" message or other suitable information on a display in test equipment 100 or by issuing an audio alert) or may take other suitable actions (step 332). In response to a determination that the test data has varied from the reference data by more than acceptable limits (i.e., if the discrepancy levels of FIGS. 18 and 19 exceed the predetermined threshold), test equipment 100 may issue an alert that informs the system operator that the device structures under test have failed testing (e.g., a "fail message") or may take other suitable action (step 334). Structures that have passed testing may, for example, be assembled into finished products and sold to customers. Structures that have failed testing may be reworked or scrapped.

The foregoing is merely illustrative of the principles of this invention and various modifications can be made by those skilled in the art without departing from the scope and spirit of the invention. The foregoing embodiments may be implemented individually or in any combination.

What is claimed is:

1. A test system for detecting manufacturing defects in conductive electronic device antenna structures under test, comprising:

temporary test structures that are brought into contact with the conductive electronic device antenna structures under test only during testing;

a fixture that receives the conductive electronic device antenna structures under test and the temporary test structures, wherein the temporary test structures are configured to enhance the detection of manufacturing defects; and test probe structures configured to convey radio-frequency test signals to the conductive electronic device antenna structures under test and to receive corresponding test data from the conductive electronic device antenna structures under test while the radio-frequency test signals are being conveyed to the conductive electronic device antenna structures under test.

2. The test system defined in claim 1, wherein the test probe structures comprise a first test probe configured to convey the radio-frequency test signals to the conductive electronic device antenna structures under test, and wherein the first test probe comprises a test probe selected from the group consisting of: a wired test probe, a wireless test probe, and a capacitive coupling test probe.

3. The test system defined in claim 2, wherein the test probe structures comprise a second test probe configured to receive the corresponding test data from the conductive electronic device antenna structures under test, and wherein the second test probe comprises a test probe selected from the group consisting of: a wired test probe, a wireless test probe, and a capacitive coupling test probe.

4. The test system defined in claim 3, wherein the temporary test structures comprise a printed circuit board on which a transmission line path is formed, and wherein the transmission line path has a first end that is coupled to a portion of the conductive electronic device antenna structures under test and a second end that is coupled to the first test probe.

5. The test system defined in claim 3, wherein the temporary test structures comprise electronic device housing structures configured to temporarily mate with the conductive electronic device antenna structures under test while the radio-frequency test signals are being conveyed to the conductive electronic device antenna structures under test.

6. The test system defined in claim 3, wherein the conductive electronic device antenna structures under test comprise a conductive peripheral housing member having at least first and second gaps, and wherein the temporary test structures comprise a conductive member having first and second ends configured to contact respective portions of the conductive peripheral housing member on opposing sides of the second gap.

7. The test system defined in claim 3, wherein the conductive electronic device antenna structures under test comprise a conductive peripheral housing member and an antenna ground member, and wherein the temporary test structures comprise a conductive member having a first end configured to contact a portion of the conductive peripheral housing member and a second end configured to contact a portion of the antenna ground member.

8. The test system defined in claim 3, wherein the temporary test structures comprise at least one conductive structure selected from the group consisting of: a flex circuit, conductive tape, metal strip, radio-frequency cables, dielectric material, resistor, capacitor, and inductor.

9. A method for manufacturing an electronic device using test equipment, wherein the electronic device includes input-output devices that receive inputs directly from a user, wherein the electronic device includes device housing structures under test at least a portion of which serves as a housing for the electronic device, and wherein the test equipment includes test probe structures and a test fixture, the method comprising:
with the test fixture, receiving the device housing structures under test;
mating temporary test structures with the device housing structures under test;
with the test probe structures, performing radio-frequency measurements on the device housing structures under test while the temporary test structures are mated with the device housing structures under test to determine whether the device housing structures under test contain a manufacturing defect; and
removing the temporary test structures from the device housing structures under test.

10. The method defined in claim 9, further comprising:
assembling the electronic device by incorporating additional structures with the device housing structures under test, wherein the temporary test structures are configured to emulate radio-frequency characteristics associated with the additional structures when the temporary test structures are mated with the device housing structures under test during radio-frequency testing.

11. The method defined in claim 10, wherein the test probe structures comprise a first test probe and wherein performing the radio-frequency measurements on the device housing structures under test comprises:
transmitting radio-frequency test signals to the device housing structures under test using the first test probe, wherein the first test probe comprises a test probe selected from the group consisting of: a wired test probe, a wireless test probe, and a capacitive coupling test probe.

12. The method defined in claim 11, wherein the test probe structures further comprise a second test probe and wherein performing the radio-frequency measurements on the device housing structures under test further comprises:
receiving corresponding radio-frequency test signals from the device housing structures under test using the second test probe, wherein the second test probe comprises a test probe selected from the group consisting of: a wired test probe, a wireless test probe, and a capacitive coupling test probe.

13. The method defined in claim 12, wherein the test equipment further includes a test unit, the method further comprising:
with the test unit, computing a complex impedance magnitude based on the transmitted and received radio-frequency test signals.

14. The method defined in claim 12, wherein the temporary test structures comprise a printed circuit board on which a transmission line path is formed and wherein mating the temporary test structures with the device housing structures under test comprises:
coupling a first end of the transmission line path to a portion of the device housing structures under test; and
coupling a second end of the transmission line path to the test probe structures.

15. The method defined in claim 12, wherein the temporary test structures comprise temporary electronic device housing structures and wherein mating the temporary test structures with the device housing structures under test comprises:
temporarily bearing the temporary electronic device housing structures against at least a portion of the device housing structures under test.

16. The method defined in claim 9, wherein the input-output devices comprise a button configured to receive inputs directly from the user.

17. A method for detecting manufacturing defects in device structures under test using test equipment having test probe structures and a test fixture, the method comprising:
receiving the device structures under test with the test fixture, wherein the device structures under test comprise a peripheral conductive housing member;
with the test probe structures, performing radio-frequency measurements on the device structures under test while the peripheral conductive housing member is placed within the test fixture;
enhancing the accuracy of the radio-frequency measurements gathered using the test-probe structures by physically mating temporary test structures with the device structures under test; and
determining whether the device structures under test contain a manufacturing defect based on results gathered from the radio-frequency measurements.

18. The method defined in claim 17, wherein the peripheral conductive housing member has at least first and second gaps, wherein the temporary test structures comprise a conductive bridging member having first and second ends, and wherein performing radio-frequency measurements on the device structures under test comprises:
gathering radio-frequency test measurements on the device structures under test while the first and second ends of the conductive bridging member is placed in contact with respective portions of the peripheral conductive housing member on opposing sides of the second gap.

19. The method defined in claim 17, wherein the device structures under test further comprises an antenna ground member, wherein the temporary test structures comprises a conductive shorting member, and wherein performing radio-frequency measurements on the device structures under test comprises:

gathering radio-frequency test measurements on the device structures under test while the conductive shorting member is coupled between a portion of the peripheral conductive housing member and a portion of the antenna ground member.

20. The method defined in claim 17, wherein the temporary test structures comprise conductive structures selected from the group consisting of: a flex circuit, conductive tape, metal strip, radio-frequency cables, dielectric material, resistor, capacitor, and inductor.

21. The method defined in claim 17, wherein the test equipment further comprises a test unit and wherein performing radio-frequency measurements on the device structures under test comprises:

with the test unit, transmitting radio-frequency test signals to the device structures under test;

with the test unit, receiving corresponding radio-frequency test signals from the device structures under test;

with the test unit, computing a complex impedance magnitude from the transmitted and received radio-frequency test signals; and comparing the complex impedance data to reference data to determine whether the device structures under test is faulty.

* * * * *